United States Patent
Kim et al.

(10) Patent No.: US 12,439,612 B2
(45) Date of Patent: Oct. 7, 2025

(54) SEMICONDUCTOR DEVICE AND MANUFACTURING METHOD OF THE SEMICONDUCTOR DEVICE

(71) Applicant: SK hynix Inc., Icheon (KR)

(72) Inventors: Hyung Keun Kim, Icheon (KR); Jun Ku Ahn, Icheon (KR); Jun Young Lim, Icheon (KR); Sung Lae Cho, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 18/624,983

(22) Filed: Apr. 2, 2024

(65) Prior Publication Data
US 2024/0251571 A1    Jul. 25, 2024

Related U.S. Application Data

(62) Division of application No. 17/234,483, filed on Apr. 19, 2021, now Pat. No. 11,974,442.

(30) Foreign Application Priority Data

Nov. 23, 2020 (KR) ................. 10-2020-0158217

(51) Int. Cl.
*H10B 63/00* (2023.01)
*H10B 61/00* (2023.01)
*H10N 50/01* (2023.01)
*H10N 70/00* (2023.01)

(52) U.S. Cl.
CPC ........... *H10B 63/845* (2023.02); *H10B 61/00* (2023.02); *H10N 50/01* (2023.02); *H10N 70/023* (2023.02); *H10N 70/823* (2023.02); *H10B 61/10* (2023.02); *H10B 63/24* (2023.02)

(58) Field of Classification Search
CPC ...... H10B 63/845; H10B 61/00; H10N 50/01; H10N 70/023; H10N 70/823
See application file for complete search history.

(56) References Cited

U.S. PATENT DOCUMENTS

| | | | |
|---|---|---|---|
| 9,406,721 B1 * | 8/2016 | Yamamoto | H10B 63/845 |
| 10,283,513 B1 | 5/2019 | Zhou et al. | |
| 10,700,128 B1 | 6/2020 | Fantini et al. | |
| 2004/0057180 A1 | 3/2004 | Pashmakov | |
| 2011/0297912 A1 | 12/2011 | Samachisa et al. | |
| 2014/0353738 A1 | 12/2014 | Makala et al. | |
| 2017/0077184 A1 * | 3/2017 | Kikuchi | H10N 70/011 |
| 2019/0027538 A1 * | 1/2019 | Sawa | H10N 70/24 |
| 2019/0140171 A1 | 5/2019 | BrightSky et al. | |
| 2019/0198569 A1 * | 6/2019 | Hsu | G11C 13/0004 |

OTHER PUBLICATIONS

First Office Action for Chinese Patent Application No. 202110885620.8, dated Dec. 28, 2024.

* cited by examiner

*Primary Examiner* — Shih Tsun A Chou

(57) ABSTRACT

A semiconductor device includes a stack structure including first electrodes and insulating layers alternately stacked on each other, a second electrode passing through the stack structure, and variable resistance patterns each interposed between the second electrode and a corresponding one of the first electrodes. Each of the first electrodes includes a first sidewall facing the second electrode, and each of the insulating layers includes a second sidewall facing the second electrode. At least a part of each of the variable resistance patterns protrudes farther towards the second electrode than the second sidewall.

20 Claims, 22 Drawing Sheets

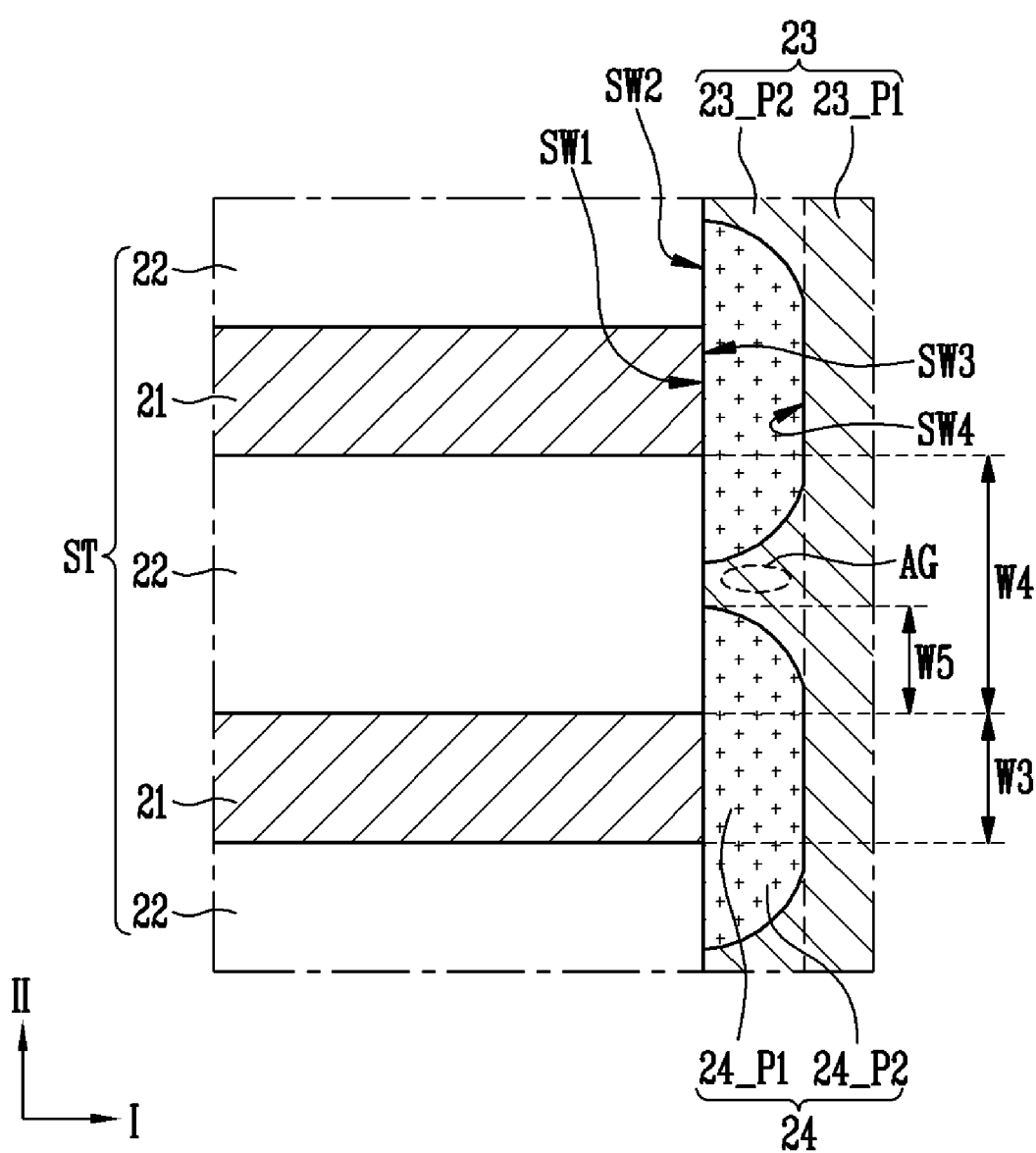

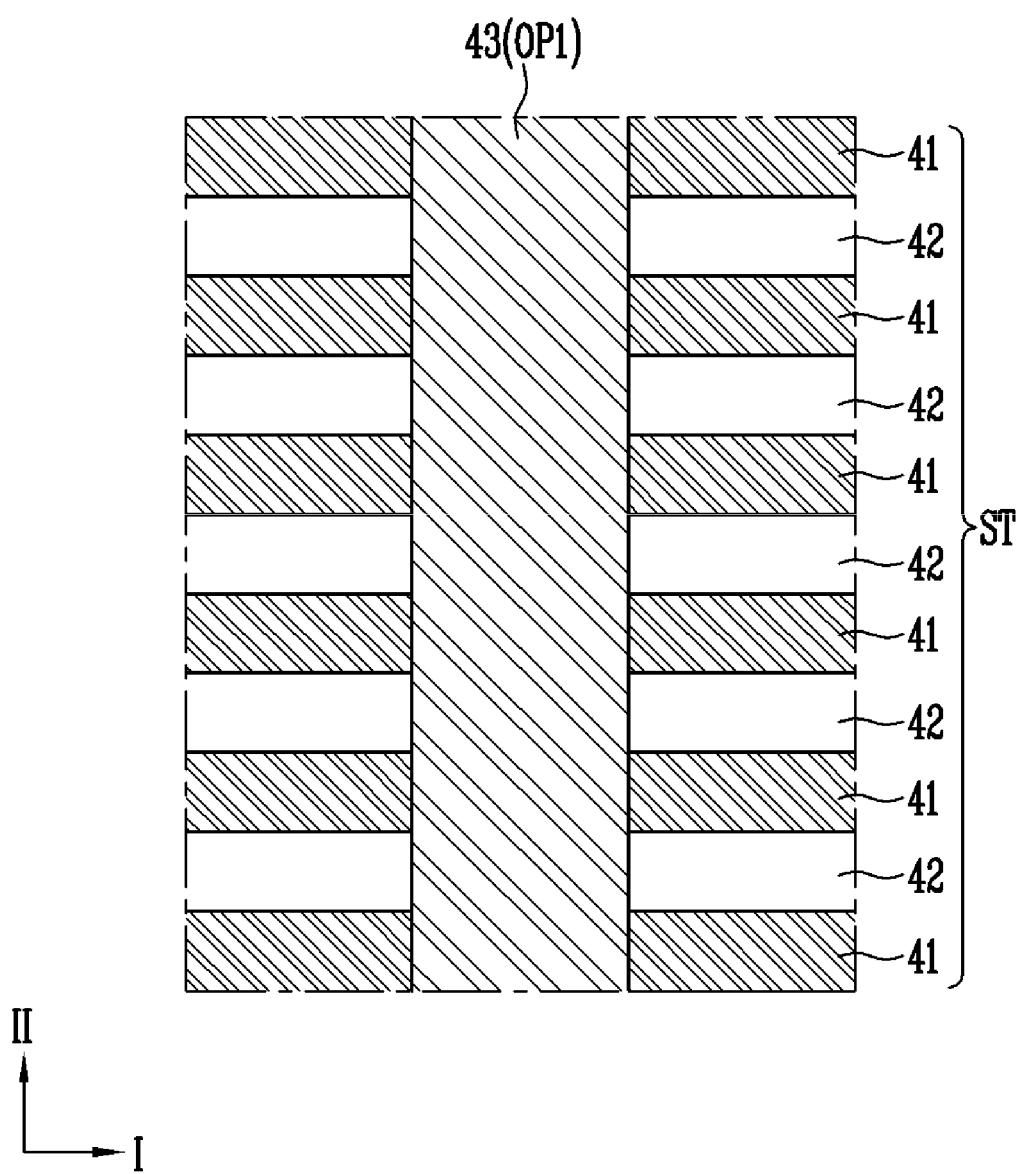

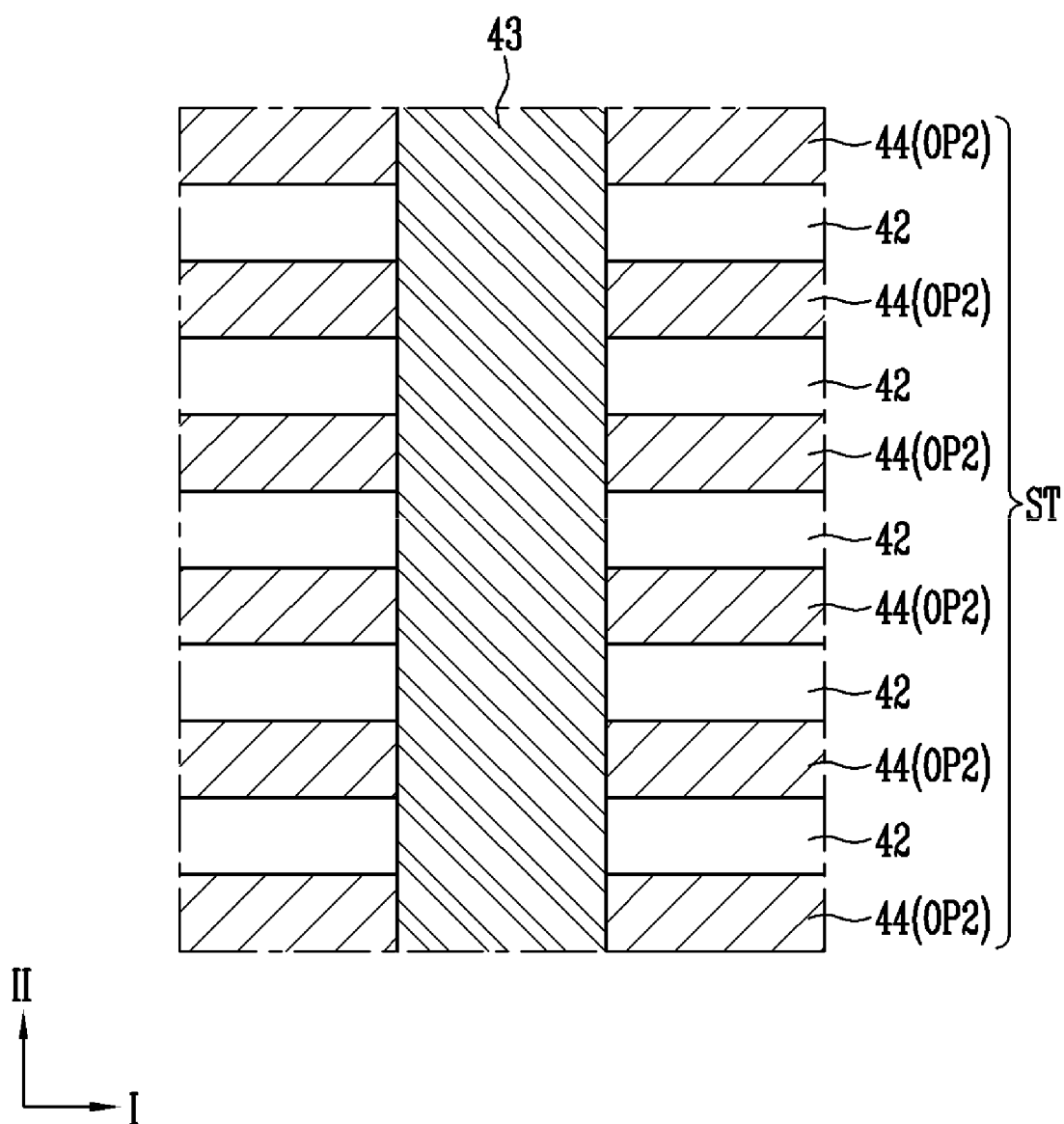

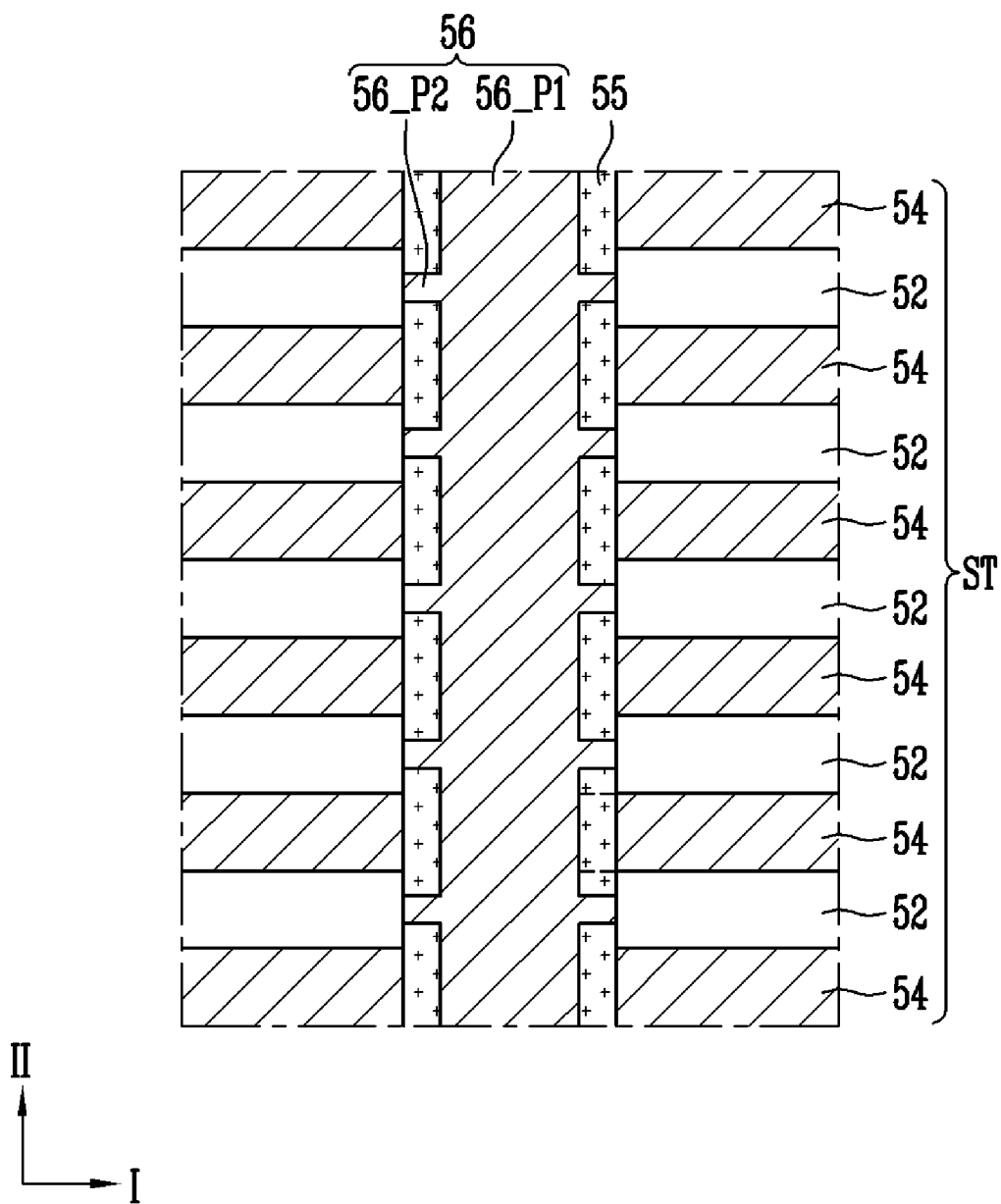

SEMICONDUCTOR DEVICE AND MANUFACTURING METHOD OF THE SEMICONDUCTOR DEVICE

CROSS-REFERENCE TO RELATED APPLICATIONS

The present application is a division of U.S. patent application Ser. No. 17/234,483 filed on Apr. 19, 2021, which claims priority under 35 U.S.C. § 119(a) to Korean Patent Application Number 10-2020-0158217, filed on Nov. 23, 2020, which is incorporated herein by reference in its entirety.

BACKGROUND

Field of Invention

Various embodiments of the present disclosure generally relate to an electronic device, and more particularly, to a semiconductor device and a method of manufacturing the semiconductor device.

Description of Related Art

Integration density of a semiconductor device is generally determined by an area occupied by a unit memory cell. Recently, due to the limitations in increasing integration density of a semiconductor device in which memory cells are formed in a single layer over a substrate, a three-dimensional semiconductor device has been proposed in which memory cells are stacked over a substrate. In addition, various structures and manufacturing methods have been developed to improve operational reliability of the semiconductor device.

SUMMARY

Various embodiments of the present disclosure are directed to a semiconductor device with a stabilized structure and improved characteristics, and a manufacturing method of the semiconductor device.

According to an embodiment, a semiconductor device may include a stack structure including first electrodes and insulating layers alternately stacked on each other, a second electrode passing through the stack structure, and variable resistance patterns each interposed between the second electrode and a corresponding one of the first electrodes, wherein each of the first electrodes includes a first sidewall facing the second electrode, wherein each of the insulating layers includes a second sidewall facing the second electrode, and wherein at least a part of each of the variable resistance patterns protrudes farther towards the second electrode than the second sidewall.

According to an embodiment, a semiconductor device may include a stack structure including first electrodes and insulating layers alternately stacked on each other, a second electrode passing through the stack structure, and variable resistance patterns each interposed between the second electrode and a corresponding one of the first electrodes, wherein each of the first electrodes includes a first sidewall facing the second electrode, wherein each of the insulating layers includes a second sidewall facing the second electrode, and wherein each of the variable resistance patterns contacts the first sidewall and the second sidewall.

According to an embodiment, a method of manufacturing a semiconductor device may include forming a stack structure including first material layers and second material layers alternately stacked on each other, forming a first opening passing through the stack structure, forming variable resistance patterns by selectively forming a variable resistance material on sidewalls of the first material layers, the variable resistance patterns protruding beyond the second material layers and extending into the first opening, and forming a first electrode in the first opening.

BRIEF DESCRIPTION OF THE DRAWINGS

FIG. 2 is a diagram illustrating a structure of a semiconductor device according to an embodiment of the present disclosure;

FIGS. 4A, 4B, 4C, and 4D are diagrams illustrating a method of manufacturing a semiconductor device according to an embodiment of the present disclosure;

FIGS. 5A, 5B, 5C, 5D, and 5E are diagrams illustrating a method of manufacturing a semiconductor device according to an embodiment of the present disclosure;

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and should not be construed as limited to the embodiments set forth herein.

Figure 1A:
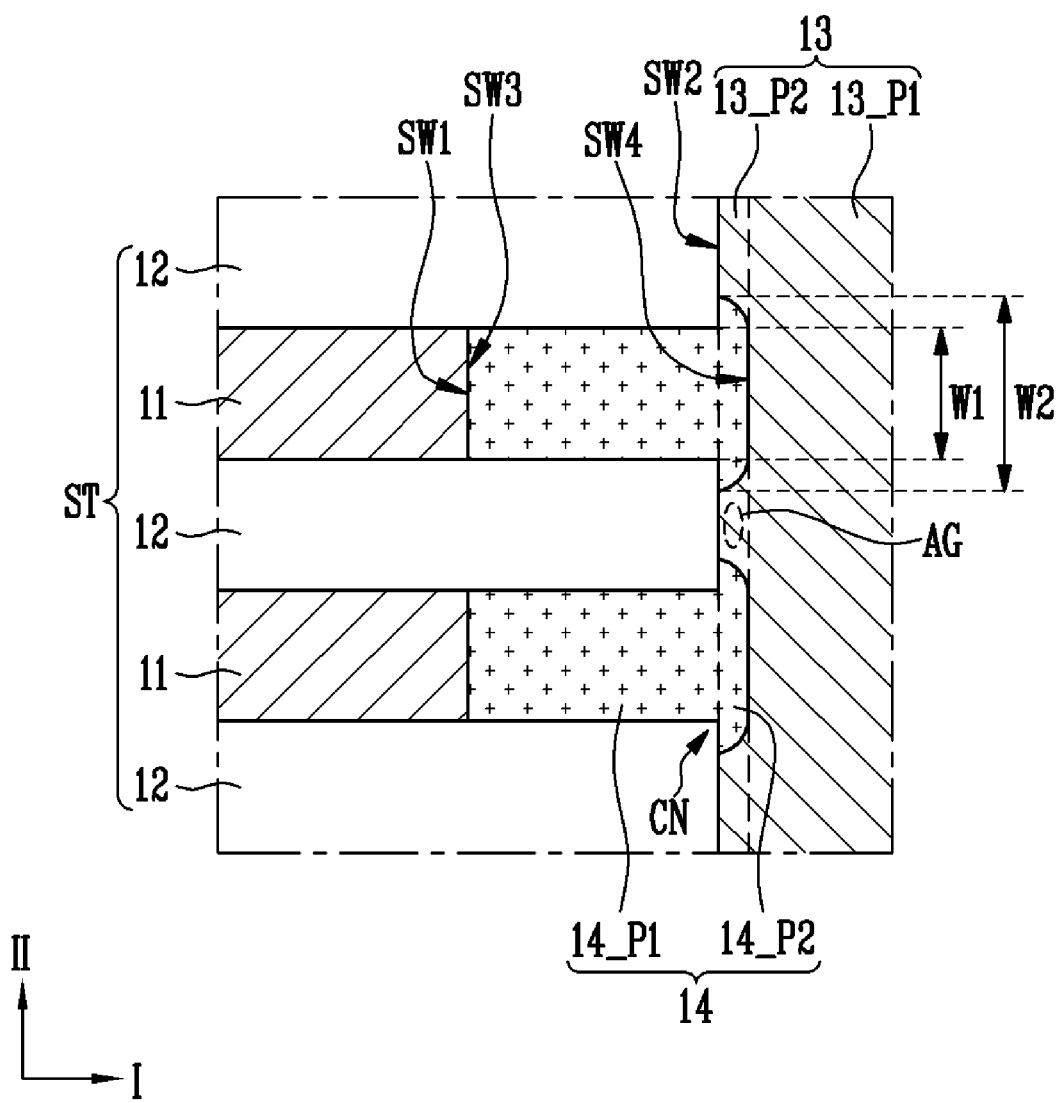
FIGS. 1A and 1B are diagrams each illustrating a structure of a semiconductor device according to an embodiment of the present disclosure.
Figure 1B:
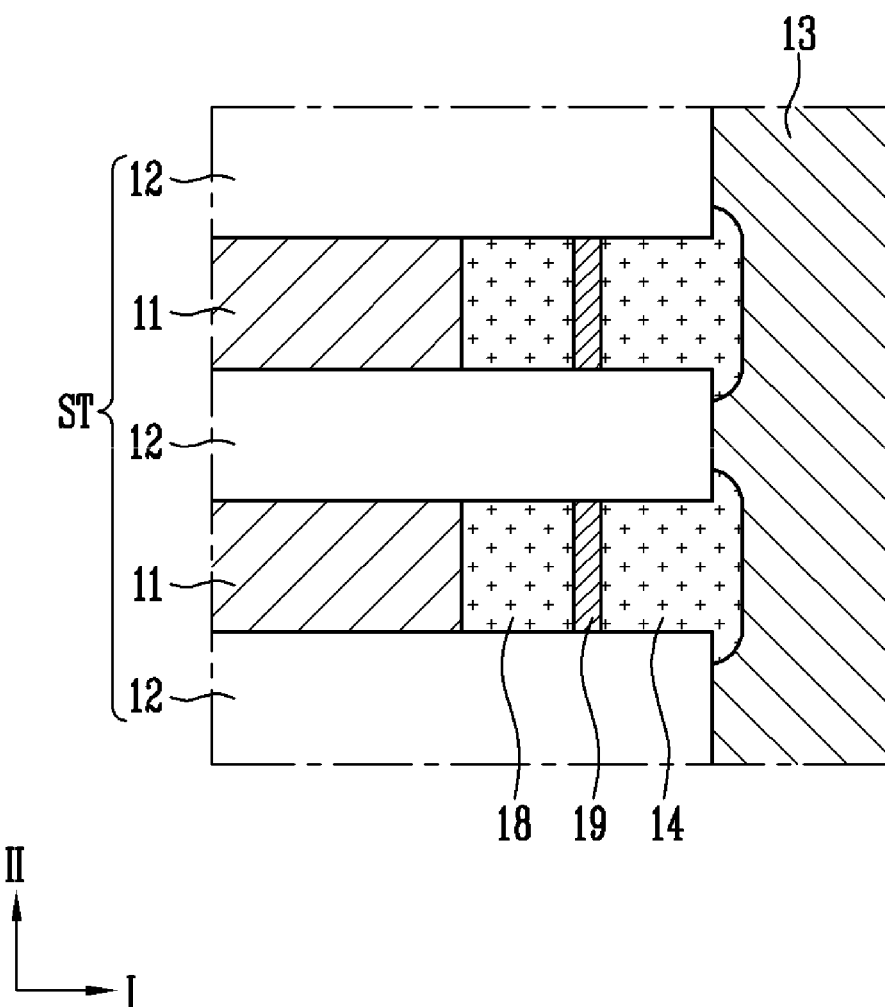

FIGS. 1A and 1B are diagrams each illustrating a structure of a semiconductor device according to an embodiment of the present disclosure.

Referring to FIG. 1A, a semiconductor device according to an embodiment of the present disclosure may include a stack structure ST, a second electrode 13, and variable resistance patterns 14.

The stack structure ST may include first electrodes 11 and insulating layers 12 alternately stacked on each other. The first electrodes 11 may be a part of word lines or may be electrically coupled to the word lines. The first electrodes 11 may include a conductive material such as polysilicon or metal. According to an embodiment, the first electrodes 11 may include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), or a combination thereof. The insulating layers 12 may insulate the first electrodes 11 from each other and may include an insulating material such as an oxide or a nitride. The insulating layers 12 may protrude farther towards the second electrode 13 than the first electrodes 11.

Each of the first electrodes 11 may include a first sidewall SW1 facing the second electrode 13. The first sidewall SW1 may extend in a second direction II. The second direction II may be a direction in which the first electrodes 11 and the insulating layers 12 are stacked. The first sidewall SW1 may be spaced apart from a sidewall of the second electrode 13 in a first direction I. The first direction I may intersect the second direction II.

Each of the insulating layers 12 may include a second sidewall SW2 facing the second electrode 13. The first sidewall SW1 may be located to be spaced apart farther from the second electrode 13 than the second sidewall SW2. The second sidewall SW2 may directly contact the second electrode 13.

The second electrode 13 may be a part of a bit line or may be electrically coupled to the bit line. The second electrode 13 may extend in a specific direction (e.g., the second direction II) that intersects the first direction I in which each of the first electrodes 11 extends. The second electrode 13 may pass through the stack structure ST in the second direction II. The second electrode 13 may include a first portion 13_P1 and second portions 13_P2. The first portion 13_P1 may extend in the second direction II. The second portions 13_P2 may be coupled to the first portion 13_P1 and may protrude from the first portion 13_P1 in a specific direction (e.g., the first direction I) intersecting with the second direction II. The second portions 13_P2 may be located to correspond to the insulating layers 12 and may contact the insulating layers 12. The second portions 13_P2 may contact the second sidewalls SW2.

The second electrode 13 may include a conductive material such as polysilicon or metal. The second electrode 13 may include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), or a combination thereof.

Memory cells may be located at intersections of the first electrodes 11 and the second electrode 13. The memory cells may include the variable resistance patterns 14, respectively. Each of the variable resistance patterns 14 may be interposed between each of the first electrodes 11 and the second electrode 13. Each of the variable resistance patterns 14 may contact the first sidewall SW1 and the second sidewall SW2. Each of the variable resistance patterns 14 may extend along the second sidewall SW2 while surrounding a corner CN of the insulating layer 12. Each of the variable resistance patterns 14 may protrude farther towards the second electrode 13 than the second sidewall SW2.

According to an embodiment, each of the variable resistance patterns 14 may include a first portion 14_P1 and a second portion 14_P2. The first portion 14_P1 may be interposed between an adjacent pair of the insulating layers 12. The second portion 14_P2 may be coupled to the first portion 14_P1 and may extend into the second electrode 13. The first portion 14_P1 may have a first width W1 in the second direction II and the second portion 14_P2 may have a second width W2 in the second direction II. The second width W2 may be substantially the same as or greater than the first width W1.

Each of the variable resistance patterns 14 may include a third sidewall SW3 and a fourth sidewall SW4. The third sidewall SW3 may extend in the second direction II and may contact the first sidewall SW1 of the first electrode 11. The fourth sidewall SW4 may extend in the second direction II and may contact the second electrode 13. The fourth sidewall SW4 might not be an etched surface formed by an etching process but may be a deposited surface formed by a deposition process. The fourth sidewall SW4 may include a curved surface. The curved surface may be formed when the variable resistance patterns 14 are selectively deposited. The curved surface may cover portions of the second sidewalls SW2. In an embodiment, the fourth sidewall SW4 includes a curved surface having an upper curved portion, a middle portion, and a lower curved portion. The upper curved portion may abut the second sidewall SW2 of an upper insulating layer 12, the middle portion is disposed between the upper and lower curved portions, and the lower curved portion may abut the second sidewall SW2 of a lower insulating layer 12 adjacent to the upper insulating layer 12 in the second direction II. Each of the upper and lower curved portions may have a curvature greater than that of the middle portion.

The variable resistance patterns 14 may have a uniform shape or different shapes from each other. A width (e.g., the second width W2 of the second portion 14_P2) in the second direction II and an extent (e.g., a width of the second portion 14_P2 in the first direction I) of protruding in the first direction I of the second portion 14_P2 may be different depending on the variable resistance patterns 14. For example, an upper portion of the stack structure ST may be exposed more to a deposition source than a lower portion of the stack structure ST when the variable resistance patterns 14 are formed by a selective deposition process. According to this embodiment, the variable resistance pattern 14 located at the upper portion of the stack structure ST may have a greater width in the second direction II, or protrude farther in the first direction I than the variable resistance pattern 14 located at the lower portion of the stack structure ST, or both. According to an embodiment, the variable resistance pattern 14 located at the upper portion of the stack structure ST may protrude farther towards the second electrode 13 than the variable resistance pattern 14 located at the lower portion of the stack structure ST.

The variable resistance patterns 14 may be spaced apart from each other in the second direction II. Each of the second portions 13_P2 of the second electrode 13 may protrude between a corresponding pair of the variable resistance patterns 14 that neighbor each other in the second direction II. Accordingly, each of the second portions 13_P2 may be interposed between an adjacent pair of the variable resistance patterns 14. According to an embodiment, at least one of the second portions 13_P2 may include an air gap AG.

The variable resistance pattern 14 may include a resistive material and reversibly transition between different resistance states depending on a voltage or current being applied.

According to an embodiment, the variable resistance pattern 14 may include a transition metal oxide or a metal oxide such as a perovskite-based material. Accordingly, data may be stored in a memory cell as an electrical path is generated or disappears in the variable resistance pattern 14.

According to an embodiment, the variable resistance pattern 14 may have an MTJ structure. The variable resistance pattern 14 may include a magnetization fixed layer, a magnetization free layer, and a tunnel barrier layer interposed therebetween. For example, the magnetization fixed layer and the magnetization free layer may include a magnetic material, and the tunnel barrier layer may include an oxide such as magnesium (Mg), aluminum (Al), zinc (Zn), or titanium (Ti). A magnetization direction of the magnetization free layer may be changed by spin torque of electrons in an applied current. Accordingly, data may be stored in a memory cell depending on changes in magnetization direction of the magnetization free layer with respect to the magnetization direction of the magnetization fixed layer.

According to an embodiment, the variable resistance pattern 14 may include a phase-change material and include a chalcogenide. The variable resistance pattern 14 may include chalcogenide glass or a chalcogenide alloy. The variable resistance pattern 14 may include silicon (Si), germanium (Ge), antimony (Sb), tellurium (Te), bismuth (Bi), indium (In), tin (Sn), selenium (Se), or a combination thereof. According to an embodiment, the variable resistance pattern 14 may be Ge—Sb—Te (GST), for example, $Ge_2Sb_2Te_5$, $Ge_2Sb_2Te_7$, $Ge_1Sb_2Te_4$, or $Ge_1Sb_4Te_7$. A phase of the variable resistance pattern 14 may vary depending on a program operation. The variable resistance pattern 14 may have a low-resistance crystalline state by a set operation. The variable resistance pattern 14 may have a high-resistance amorphous state by a reset operation. Accordingly, data may be stored in a memory cell by using a difference in resistance depending on a phase of the variable resistance pattern 14.

According to an embodiment, the variable resistance pattern 14 may include a variable resistance material having a resistance that varies without changing a phase, and may include a chalcogenide-based material. The variable resistance pattern 14 may include germanium (Ge), antimony (Sb), tellurium (Te), arsenic (As), selenium (Se), silicon (Si), indium (In), tin (Sn), sulfur (S), gallium (Ga), or a combination thereof. According to an embodiment, the variable resistance pattern 14 may include $As_2Te_3$, or $As_2Se_3$. The variable resistance pattern 14 may include a chalcogenide that maintains an amorphous state. The variable resistance pattern 14 may have an amorphous state and might not be changed to a crystalline state during a program operation. Accordingly, a threshold voltage of a memory cell may vary depending on a program voltage applied to the memory cell. The memory cell may be programmed into at least two states. When a negative program voltage is applied to the memory cell, the variable resistance pattern 14 may have a high-resistance amorphous state. When a positive program voltage is applied to the memory cell, the variable resistance pattern 14 may have a low-resistance amorphous state. Accordingly, data may be stored in the memory cell by using a difference in threshold voltage of the memory cell.

Referring to FIG. 1B, a semiconductor device may have a similar structure to the semiconductor device as described above with reference to FIG. 1A, and may further include switching patterns 18, or third electrodes 19, or both. According to the embodiment shown in FIG. 1B, a memory cell may include a selection element and a memory element.

The first electrode 11, the switching patterns 18, and the third electrode 19 may form the selection element. The selection element may be a diode, a PNP diode, a transistor, a vertical transistor, a Bipolar Junction Transistor (BJT), a Metal Insulator Transition (MIT) element, a Mixed Ionic-Electronic Conduction (MIEC) element, an Ovonic Threshold Switching (OTS) element, or the like. According to an embodiment, the switching patterns 18 may include a chalcogenide-based material such as AsTe, AsSe, AsTeSe, AsTeGe, AsSeGe, AsTeGeSe, GeTe, GeSe, or GeTeSe. The third electrode 19, the variable resistance patterns 14, and the second electrode 13 may form the memory element. The variable resistance pattern 14 may include a resistive material, a Magnetic Tunnel Junction (MTJ), a phase-change material, or a combination thereof.

Locations of the variable resistance patterns 14 and the switching patterns 18 may be switched to each other. The variable resistance pattern 14 may be located between the first electrode 11 and the third electrode 19, and the switching pattern 18 may be located between the third electrode 19 and the second electrode 13.

According to the structure as described above, the memory cells are stacked and therefore memory integration density of the semiconductor device may be improved. In addition, the memory cells may include the variable resistance patterns 14, respectively, and the variable resistance patterns 14 may be spaced apart from each other. For example, ends of an adjacent pair of the second portions 14_P2 of the variable resistance patterns 14 may be spaced apart from each other in the second direction II. A conventional semiconductor device including a continuous variable resistance pattern, rather than a plurality of variable resistance patterns spaced apart from each other, may not reliably perform one or more operations (e.g., a write operation). Accordingly, the operational reliability of the memory cell may be improved compared to the conventional semiconductor device.

FIG. 2 is a diagram illustrating a structure of a semiconductor device according to an embodiment of the present disclosure. Hereinafter, a detailed description of components already described above may be omitted for the sake of brevity.

Referring to FIG. 2, the semiconductor device according to an embodiment of the present disclosure may include the stack structure ST, a second electrode 23, and variable resistance patterns 24.

The stack structure ST may include first electrodes 21 and insulating layers 22 alternately stacked on each other. The first electrodes 21 may include a conductive material such as polysilicon or metal. The insulating layers 22 may insulate the first electrodes 21 from each other and may include an insulating material such as an oxide or a nitride. Each of the first electrodes 21 may have a third width W3 in the second direction II and each of the insulating layers 22 may have a fourth width W4 in the second direction II. The third width W3 may be substantially the same as the fourth width W4 or the fourth width W4 may be greater than the third width W3.

Each of the first electrodes 21 may include the first sidewall SW1 facing the second electrode 23. The first sidewall SW1 may contact the variable resistance pattern 24. Each of the insulating layers 22 may include the second sidewall SW2 facing the second electrode 23. The second sidewall SW2 may contact the variable resistance pattern 24 and the second electrode 23. The first sidewall SW1 may be substantially aligned with the second sidewall SW2. The first sidewall SW1 may be located substantially on an extending line of the second sidewall SW2. For example, an acute angle defined by a line of the first sidewall SW1 and the extending line of the second sidewall SW2 may be equal to or less than 5°, 3°, or 1°, or 0.5°.

The second electrode 23 may pass through the stack structure ST in the second direction II. The second electrode 23 may include a first portion 23_P1 and second portions 23_P2. The first portion 23_P1 may extend in the second direction II. The second portions 23_P2 may be coupled to the first portion 23_P1 and may protrude from the first portion 23_P1 in a direction (e.g., the first direction I) intersecting with the second direction II. The second portions 23_P2 may be located to correspond to the insulating layers 22 and may contact the insulating layers 22. The second portions 23_P2 may contact the second sidewalls SW2. The second electrode 23 may include a conductive material such as polysilicon or metal.

Each of the variable resistance patterns 24 may be interposed between each of the first electrodes 21 and the second electrode 23. Each of the variable resistance patterns 24 may contact the first sidewall SW1 and the second sidewall SW2. Each of the variable resistance patterns 24 may cover an interface between each of the first electrodes 21 and each of the insulating layers 22. Each of the variable resistance patterns 24 may protrude farther towards the second electrode 23 than the first sidewall SW1 and the second sidewall SW2.

According to an embodiment, each of the variable resistance patterns 24 may include a first portion 24_P1 and a second portion 24_P2. The first portion 24_P1 may be interposed between the first electrode 21 and the second electrode 23. The second portion 24_P2 may be interposed between the insulating layer 22 and the second electrode 23. One variable resistance pattern 24 may include a pair of the second portions 24_P2 and one first portion 24_P1 located between the pair of the second portions 24_P2. The first portion 24_P1 and the second portion 24_P2 may extend into the second electrode 23.

Each of the variable resistance patterns 24 may include the third sidewall SW3 and the fourth sidewall SW4. The third sidewall SW3 may extend in the second direction II and may contact the first sidewall SW1 of the first electrode 21 and the second sidewalls SW2 of the insulating layers 22. The fourth sidewall SW4 may extend in the second direction II and may contact the second electrode 23. The fourth sidewall SW4 may include a curved surface. The curved surface may be formed when the variable resistance patterns 24 are selectively deposited. In an embodiment, the fourth sidewall SW4 of the variable resistance pattern 24 includes a curved surface having an upper curved portion of a first one of the pair of the second portions 24_P2, a middle portion of the first portion 24_P1, and a lower curved portion of a second one of the pair of the second portions 24_P2. Each of the upper and lower curved portions may have a curvature greater than that of the middle portion.

The variable resistance patterns 24 may have a uniform shape or different shapes from each other. The respective variable resistance patterns 24 may have different widths in the second direction II and protrude in the first direction I to different extents. For example, an upper portion of the stack structure ST may be exposed more to a deposition source than a lower portion of the stack structure ST when the variable resistance patterns 24 are formed by a selective deposition process. According to this embodiment, the variable resistance pattern 24 located at the upper portion of the stack structure ST may have a greater width in the second direction II, or protrude farther in the first direction I than the variable resistance pattern 24 located at the lower portion of the stack structure ST, or both. According to an embodiment, the variable resistance pattern 24 located at the upper portion of the stack structure ST may protrude farther towards the second electrode 23 than the variable resistance pattern 24 located at the lower portion of the stack structure ST.

The variable resistance patterns 24 may be spaced apart from each other in the second direction II. Each of the second portions 24_P2 of each of the variable resistance patterns 24 may have a fifth width W5 in the second direction II and the fifth width W5 may be smaller than half of the fourth width W4, thereby ensuring that ends of an adjacent pair of the second portions 24_P2 of the variable resistance patterns 24 in the second direction II are spaced apart from each other. Each of the second portions 23_P2 of the second electrode 23 may protrude between a corresponding pair of the variable resistance patterns 24 that neighbor each other in the second direction II. When the fourth width W4 of each of the insulating layers 22 is greater than the third width W3 of each of the first electrodes 21, a distance between each pair of the variable resistance patterns 24 may be sufficiently secured. According to an embodiment, at least one of the second portions 23_P2 may include the air gap AG.

According to the structure as described above, memory cells may be located at intersections of the first electrodes 21 and the second electrode 23. Accordingly, integration density of a semiconductor device may be improved. In addition, the memory cells may include the variable resistance patterns 24, respectively, and the variable resistance patterns 24 may be spaced apart from each other. Accordingly, the operational reliability of the memory cell may be improved compared to a conventional semiconductor device including a continuous variable resistance pattern.

FIGS. 3A to 3F are diagrams illustrating a method of manufacturing a semiconductor device according to an embodiment of the present disclosure. Hereinafter, a detailed description of components already described above may be omitted for the sake of brevity.

Figure 3A:
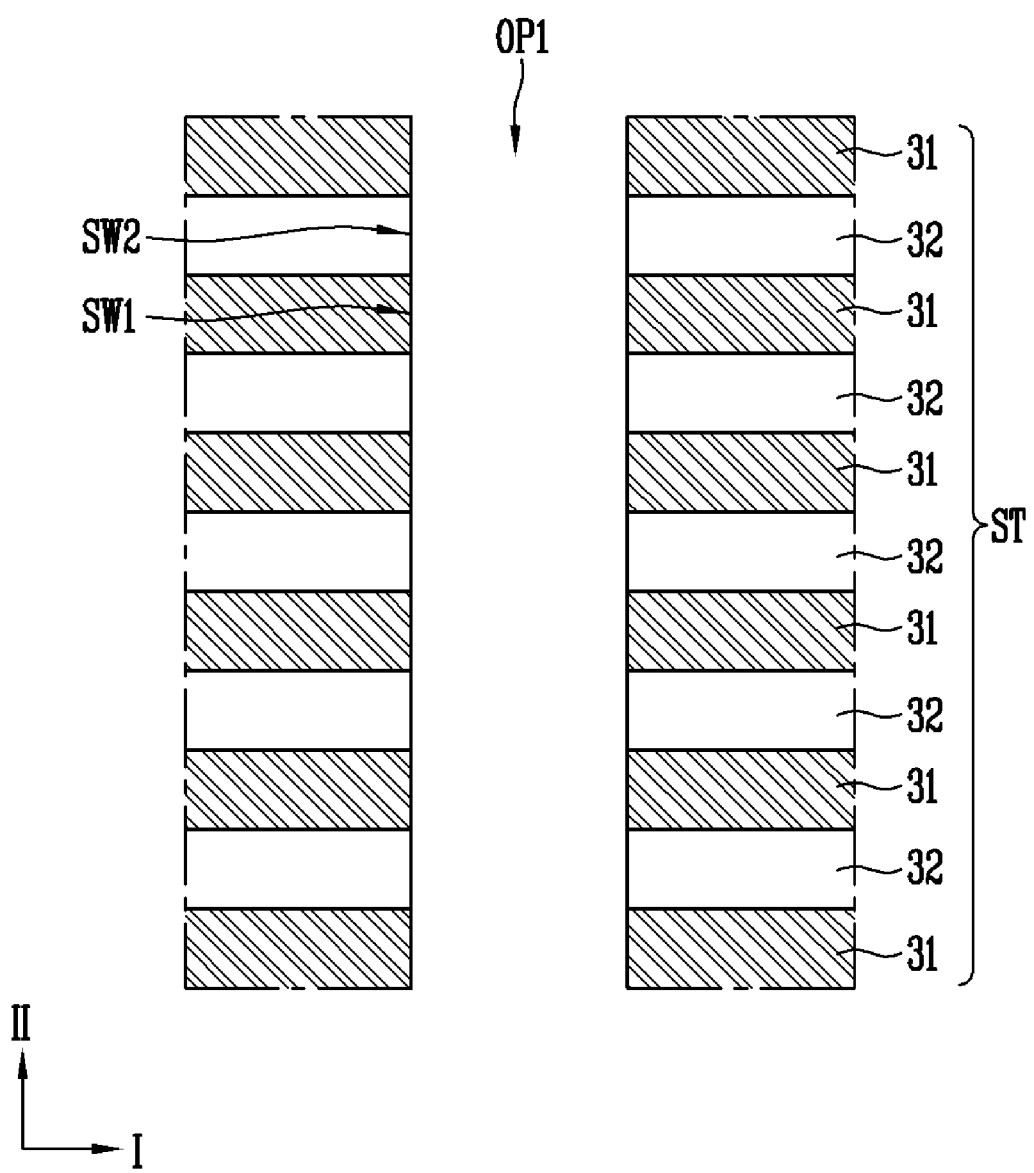
FIGS. 3A, 3B, 3C, 3D, 3E, and 3F are diagrams illustrating a method of manufacturing a semiconductor device according to an embodiment of the present disclosure.

Referring to FIG. 3A, a stack structure ST may be formed. The stack structure ST may include first material layers 31 and second material layers 32 alternately stacked on each other. The first material layers 31 may include a material having high etch selectivity with respect to the second material layers 32. The first material layers 31 may be provided to form first electrodes of memory cells. According to an embodiment, the first material layers 31 may include a sacrificial material such as a nitride and the second material layers 32 may include an insulating material such as an oxide. According to an embodiment, the first material layers 31 may include a conductive material such as polysilicon and metal and the second material layers 32 may include an insulating material such as an oxide.

Subsequently, a first opening OP1 passing through the stack structure ST may be formed. The first opening OP1 may pass through the stack structure ST in the second direction II. The first sidewalls SW1 of the first material layers 31 and the second sidewalls SW2 of the second material layers 32 may be defined by the first opening OP1.

Figure 3B:
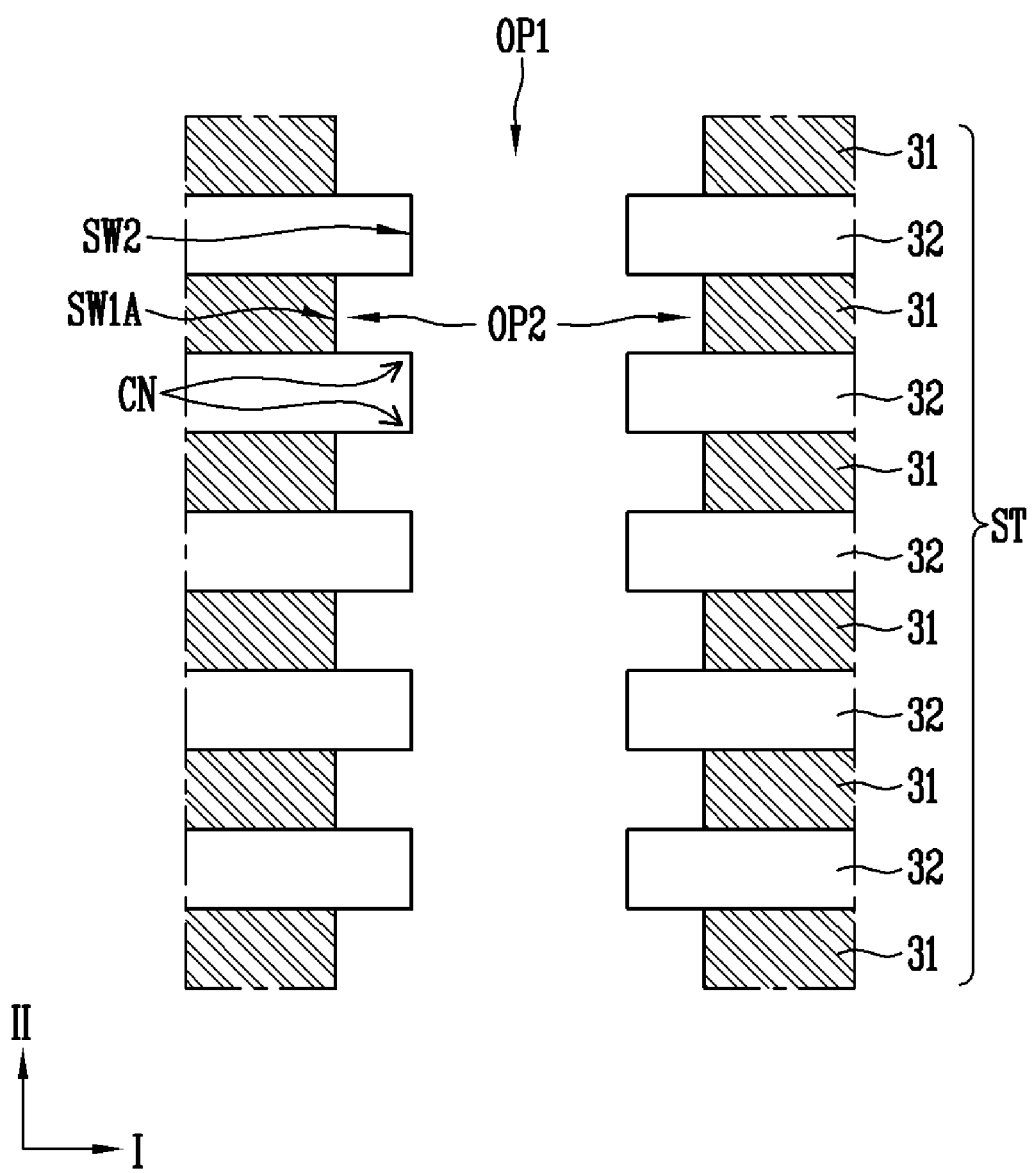

Referring to FIG. 3B, second openings OP2 may be formed. According to an embodiment, the second openings OP2 may be formed by selectively etching the first material layers 31 through the first opening OP1. According to an embodiment, the second openings OP2 may be formed by selectively depositing a second material on the second sidewalls SW2 of the second material layers 32. The second openings OP2 may be coupled to the first opening OP1 and each of the second openings OP2 may be located between an adjacent pair of the second material layers 32.

First sidewalls SW1A of the first material layers 31 may be newly defined by forming the second openings OP2. The first sidewalls SW1A may be spaced apart farther from the center of the first opening OP1 than the second sidewalls SW2. In addition, the second material layers 32 may extend farther into the first opening OP1 than the first material layers 31. The corners CN of the second material layers 32 may be exposed to the first opening OP1 and the second openings OP2.

Figure 3C:
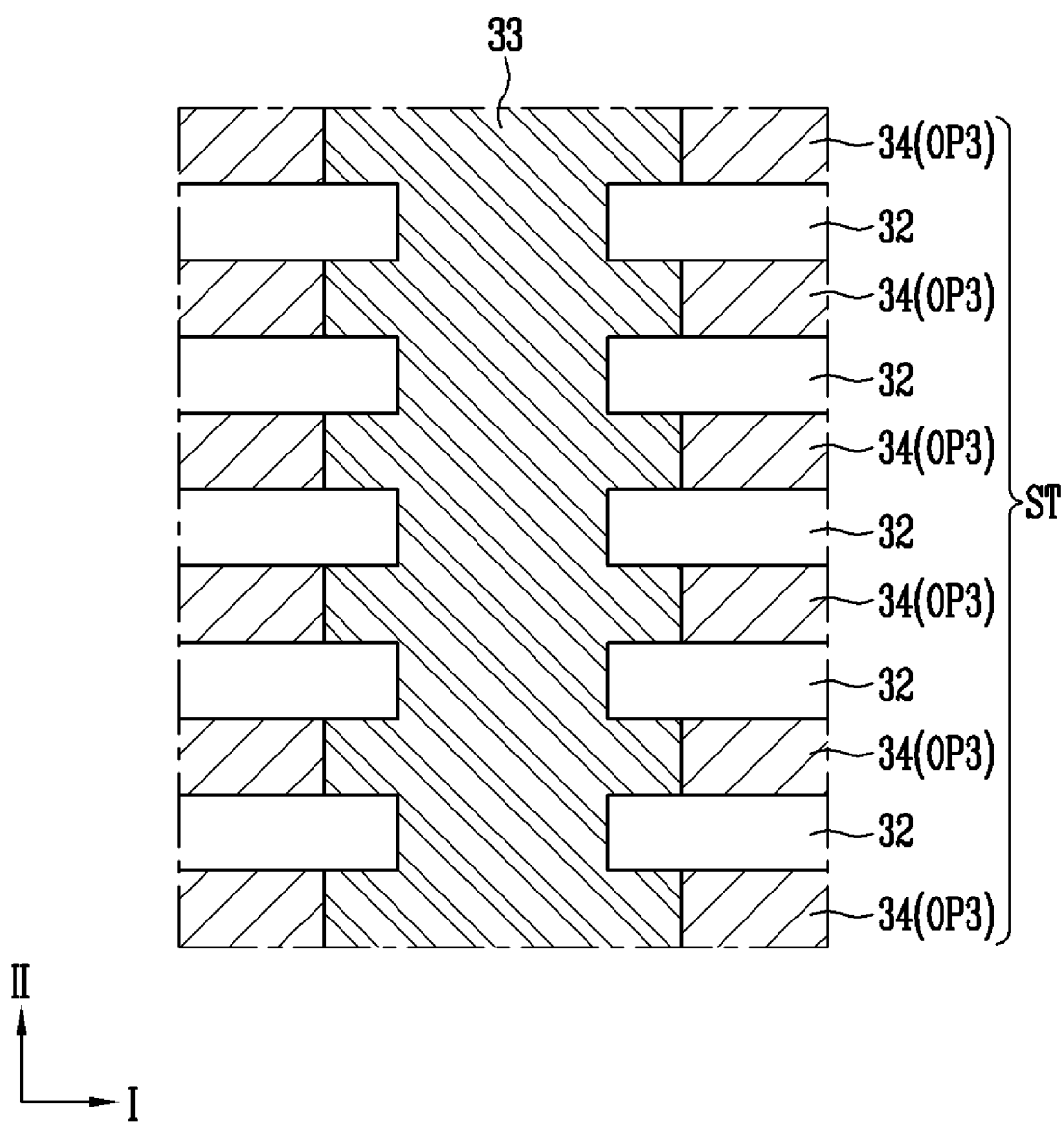

Referring to FIG. 3C, a sacrificial layer 33 may be formed in the first opening OP1 and the second openings OP2. The sacrificial layer 33 may include a single layer or multiple layers. The sacrificial layer 33 may include a material having high etch selectivity with respect to the first material layers 31 and the second material layers 32. In addition, the sacrificial layer 33 may include a material having high etch selectivity with respect to third material layers 34 to be formed during a subsequent process.

Subsequently, the first material layers 31 in FIG. 3B may be replaced by the third material layers 34. The third material layers 34 may be first electrodes. According to an embodiment, when the first material layers 31 include a sacrificial material and the second material layers 32 include an insulating material, the third material layers 34 may include a conductive material. First, after a slit (not shown) passing through the stack structure ST is formed, third openings OP3 may then be formed by selectively etching the first material layers 31 through the slit. The sacrificial layer 33 may serve as a supporting structure that supports the second material layers 32. Subsequently, the third material layers 34 may be formed in the third openings OP3. According to an embodiment, when the first material layers 31 include a conductive material and the second material layers 32 include an insulating material, the third material layers 34 may include metal silicide. After the slit (not shown) passing through the stack structure ST is formed, the third material layers 34 may then be formed by silicidizing the first material layers 31 through the slit. A process of replacing the first material layers 31 by the third material layers 34 may be omitted and when the process is omitted, the first material layers 31 may remain and serve as first electrodes.

Figure 3D:
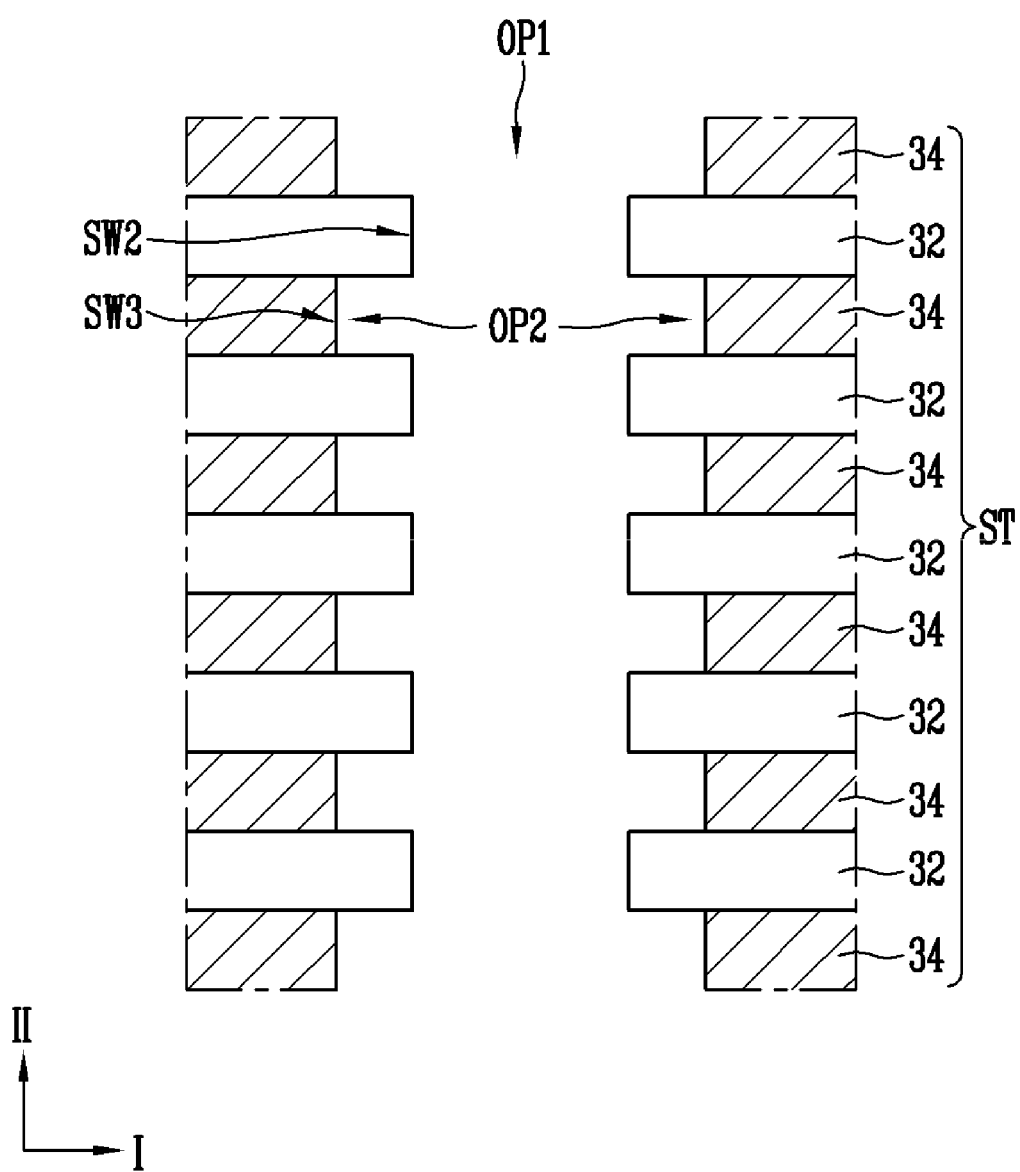

Referring to FIG. 3D, the sacrificial layer 33 may be removed. The sacrificial layer 33 may be selectively etched under a condition where etch selectivity is high with respect to the second material layers 32 and the third material layers 34. Thereby, the first opening OP1 and the second openings OP2 may be opened again. The third material layers 34 may have the third sidewalls SW3 and the third sidewalls SW3 may be exposed through the second openings OP2.

Figure 3E:
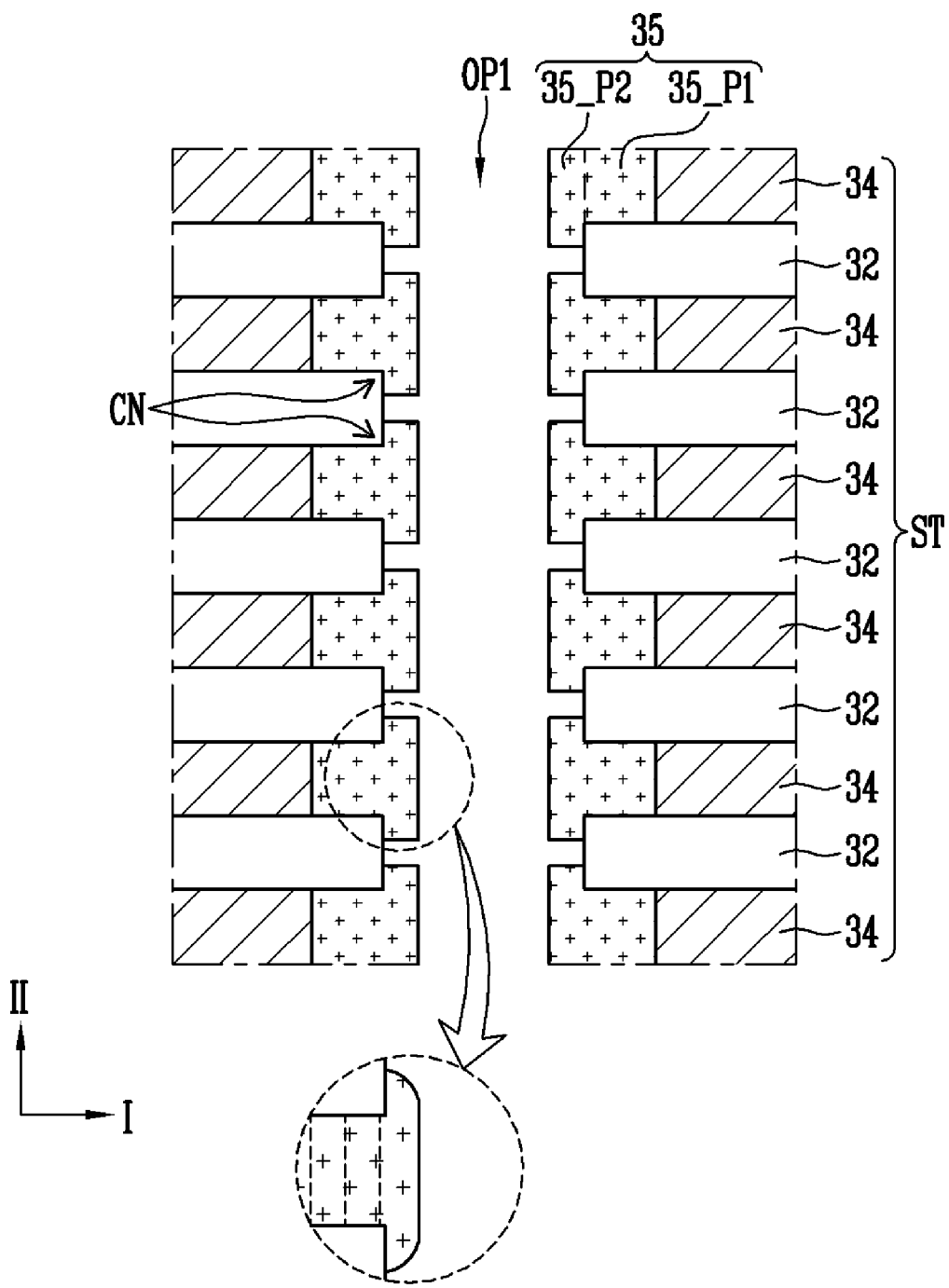

Referring to FIG. 3E, variable resistance patterns 35 may be formed. The variable resistance patterns 35 may be selectively formed in the second openings OP2 by performing a deposition process under a condition where a deposition rate (or a growth rate) of a variable resistance material on surfaces of the third material layers 34 is higher than a deposition rate (or a growth rate) of the variable resistance material on surfaces of the second material layers 32.

The variable resistance patterns 35 may fill the second openings OP2, respectively, and may extend into the first opening OP1. Each of the variable resistance patterns 35 may include a first portion 35P_1 and a second portion 35_P2. The first portion 35P_1 may be located in each of the second openings OP2 and may be interposed between the second material layers 32 stacked in the second direction II. The second portion 35_P2 may be coupled to the first portion 35_P1 and may extend into the first opening OP1.

The variable resistance patterns 35 may be formed by selectively depositing a variable resistance material on the third sidewalls SW3 of the third material layers 34. According to an embodiment, a selective deposition may be performed by a selective growth method. The variable resistance patterns 35 may be formed by selectively growing a variable resistance material from the third material layers 34. The third sidewalls SW3 of the third material layers 34 which are exposed through the second openings OP2 may be used as seeds to grow the variable resistance material, whereas surfaces of the second material layers 32 including the second sidewalls SW2 may not be significantly used as seeds to grow the variable resistance material.

When the variable resistance patterns 35 are formed, the variable resistance material may be selectively deposited while filling the second openings OP2 from surfaces of the third material layers 34. Accordingly, the variable resistance patterns 35 may include curved surfaces resulting from a deposition process (please refer to an enlarged view in a dashed circle of FIG. 3E). In addition, the variable resistance patterns 35 may extend into the first opening OP1 by overdepositing or overgrowing the variable resistance material when the variable resistance patterns 35 are formed. According to this embodiment, the variable resistance material may be deposited or grown while covering the corners CN of the second material layers 32. One or more growth conditions of the variable resistance material may be adjusted such that the variable resistance patterns 35 that neighbor in the second direction II are spaced apart from each other while covering the corners CN. Specifically, the variable resistance material may be deposited or grown until each of the variable resistance patterns 35 has a size sufficiently large to reduce one or more defects and sufficiently small to ensure separation between an adjacent pair of the variable resistance patterns 35 in the second direction II. In an embodiment, each of the variable resistance patterns 35 may have a size sufficiently large to cover corners CN of a corresponding pair of the second material layers 32, thereby reducing defects caused by permeation of a conductive material or a chemical into interfaces between the second material layers 32 and the variable resistance patterns 35.

Switching patterns and third electrodes may be further formed in the second openings OP2. According to an embodiment, the switching patterns (e.g., the switching patterns 18 in FIG. 1B) may be selectively deposited or grown on the third sidewalls SW3 of the third material layers 34. Subsequently, the third electrodes (e.g., the third electrodes 19 in FIG. 1B) may be selectively deposited or grown on sidewalls of the switching patterns. Subsequently, a variable resistance patterns (e.g., the variable resistance patterns 14 in FIG. 1B) may be selectively deposited or grown on sidewalls of the third electrodes.

Figure 3F:
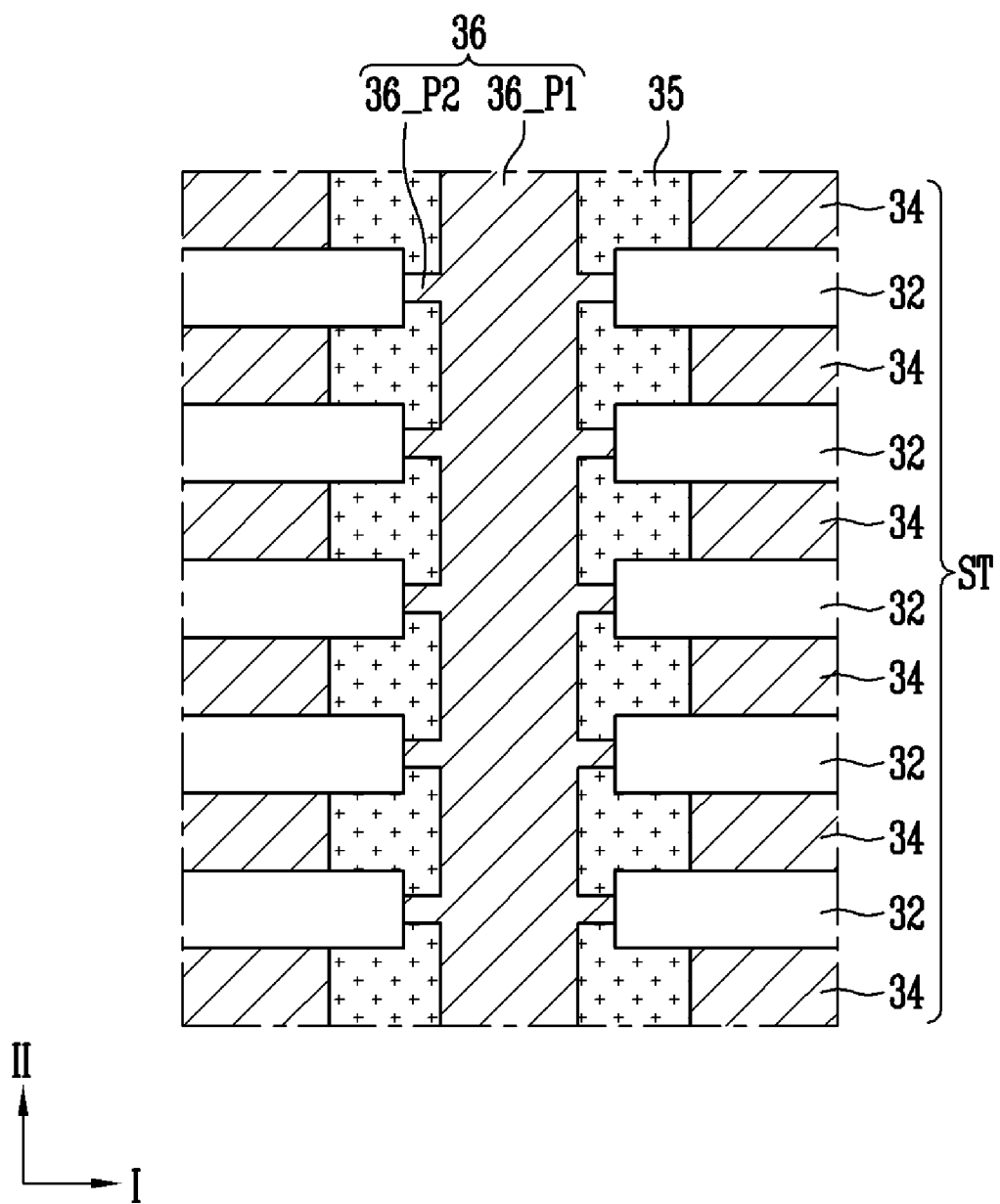

Referring to FIG. 3F, a conductive layer 36 may be formed in the first opening OP1. The conductive layer 36 may be a second electrode. The conductive layer 36 may include a first portion 36_P1 and second portions 36_P2. The first portion 36_P1 may extend in the second direction II. The second portions 36_P2 may be coupled to the first portion 36_P1 and each of the second portions 36_P2 may protrude from the first portion 36_P1 in the first direction I. Each of the second portions 36_P2 may be interposed between the variable resistance patterns 35.

The conductive layer 36 may be formed using a deposition process. A conductive material, for example, metal may permeate interfaces between the second material layers 32 and the variable resistance patterns 35 during the deposition process. Alternatively, a chemical such as deposition gas may permeate the interfaces between the second material layers 32 and the variable resistance patterns 35 during the deposition process. Thereby, a defect may be caused. However, one or more defects, which are caused by permeation of the conductive material or the chemical into the interfaces between the second material layers 32 and the variable resistance patterns 35, may be substantially prevented or minimized by forming the variable resistance patterns 35 to cover the corners of the second material layers 32.

According to the manufacturing method as described above, the variable resistance patterns 35 may be formed to be spaced apart from each other. Accordingly, an etching process for spacing the variable resistance patterns 35 apart from each other does not have to be performed and damage to the variable resistance patterns 35 resulting from the etching process may be substantially prevented, thereby improving operation reliability of memory cells including the variable resistance patterns 35. In addition, an amount of one or more materials to form the variable resistance patterns 35 using the above-described manufacturing method may be reduced compared to that when a continuous variable resistance pattern is formed and then an etching process is performed on the continuous variable resistance pattern to make a plurality of variable resistance patterns spaced apart from each other.

FIGS. 4A to 4D are diagrams illustrating a method of manufacturing a semiconductor device according to an embodiment of the present disclosure. Hereinafter, a detailed description of components already described above may be omitted for the sake of brevity.

Referring to FIG. 4A, a stack structure ST may be formed. The stack structure ST may include first material layers 41 and second material layers 42 alternately stacked on each other. The first material layers 41 may include a material having high etch selectivity with respect to the second material layers 42.

Subsequently, a first opening OP1 passing through the stack structure ST may be formed. The first opening OP1 may pass through the stack structure ST in the second direction II. Subsequently, a sacrificial layer 43 may be formed in the first opening OP1. The sacrificial layer 43 may include a single layer or multiple layers. The sacrificial layer 43 may include a material having high etch selectivity with respect to the first material layers 41, the second material layers 42, and third material layers 44 to be formed in a subsequent process.

Referring to FIG. 4B, the first material layers 41 may be replaced by the third material layers 44. The third material layers 44 may be first electrodes. The third material layers 44 may include a conductive material, metal silicide, or the like. Alternatively, a process of replacing the first material layers 41 in FIG. 4A by the third material layers 44 may be omitted.

Figure 4C:
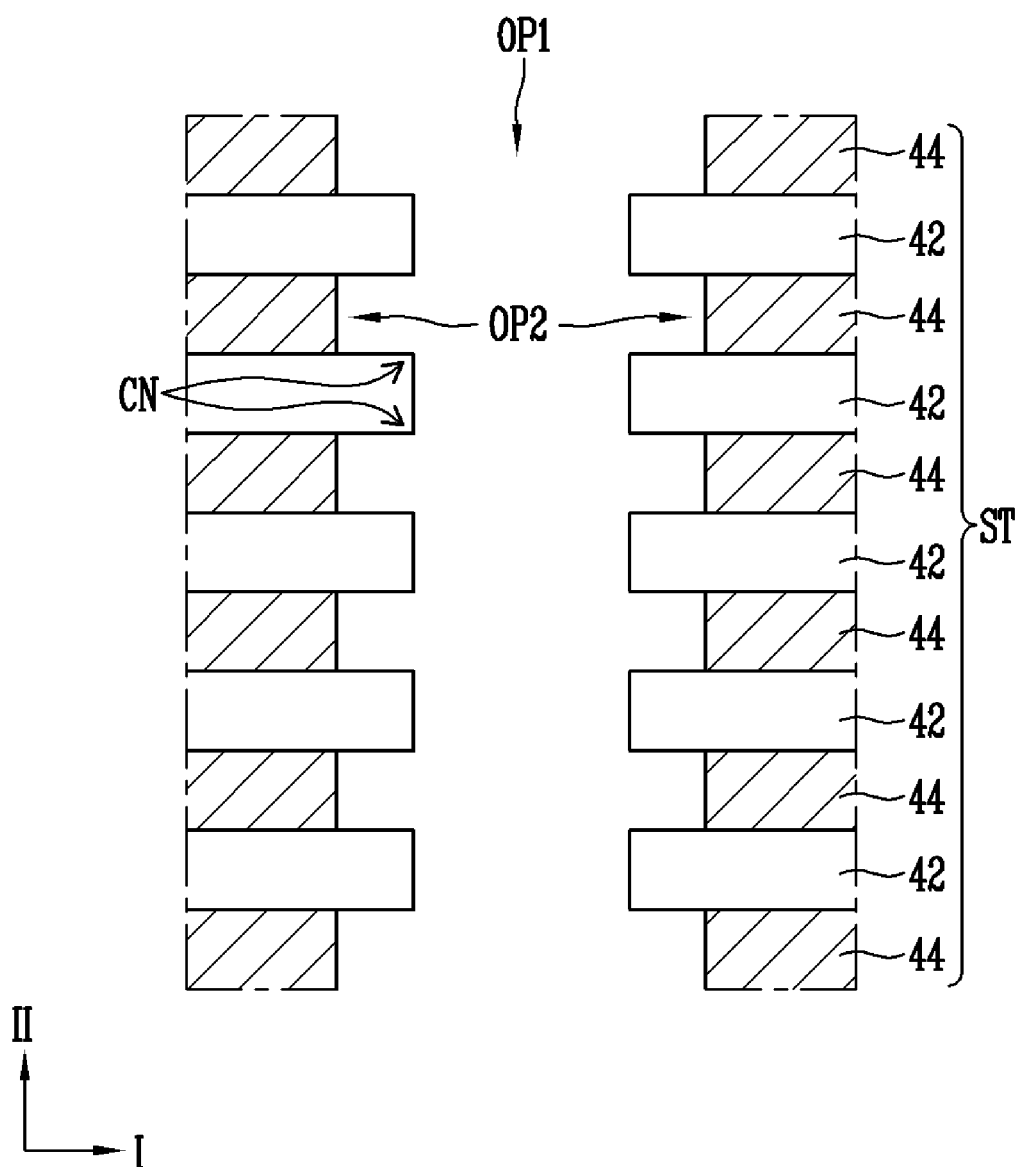

Referring to FIG. 4C, the sacrificial layer 43 may be removed. Accordingly, the first opening OP1 may be opened again. Subsequently, second openings OP2 may be formed. According to an embodiment, the second openings OP2 may be formed by selectively etching the third material layers 44 through the first opening OP1. The second openings OP2 may be coupled to the first opening OP1 and may be located between the second material layers 42. Each of the second openings OP2 may extend in a direction that is substantially orthogonal to the first opening OP1.

The second material layers 42 may protrude farther than the third material layers 44 by forming the second openings OP2. The corners CN of the second material layers 42 may be exposed to the first opening OP1 and the second openings OP2.

Figure 4D:
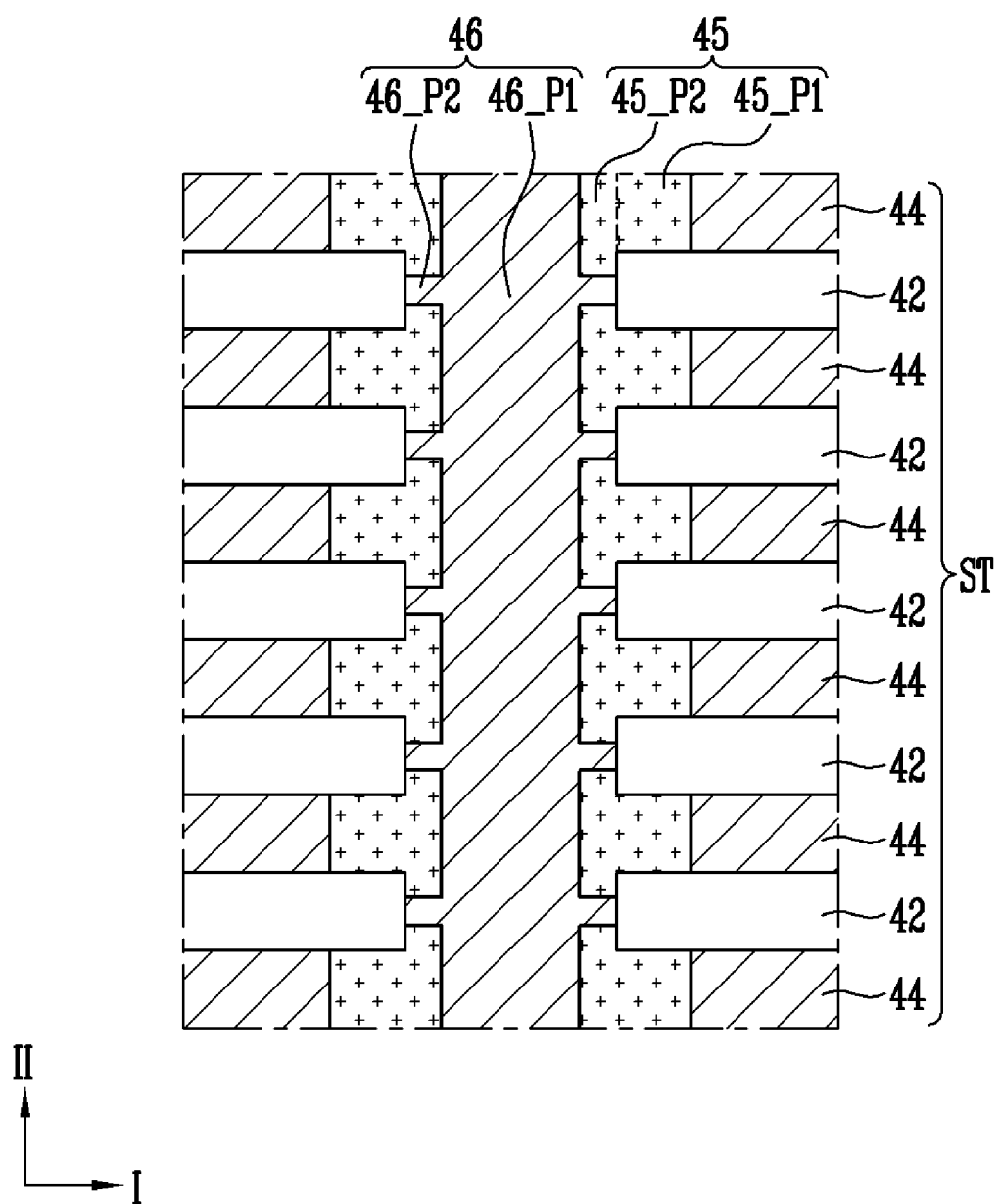

Referring to FIG. 4D, variable resistance patterns 45 may be formed. The variable resistance patterns 45 may fill the second openings OP2, respectively, and may extend into the first opening OP1. Each of the variable resistance patterns 45 may include a first portion 45_P1 and a second portion 45_P2. The first portion 45_P1 may be located in each of the second openings OP2 and may be interposed between the second material layers 42 stacked in the second direction II. The second portion 45_P2 may be coupled to the first portion 45_P1 and may extend into the first opening OP1. According to an embodiment, the variable resistance patterns 45 may be formed by a selective deposition method or a selective growth method.

Subsequently, a conductive layer 46 may be formed in the first opening OP1. The conductive layer 46 may be a second electrode. The conductive layer 46 may include a first portion 46_P1 and second portions 46_P2. The first portion 46_P1 may extend in the second direction II. The second portions 46_P2 may be coupled to the first portion 46_P1 and each of the second portions 46_P2 may protrude from the first portion 46_P1 in the first direction I. Each of the second portions 46_P2 may be interposed between the variable resistance patterns 45.

According to the manufacturing method as described above, the variable resistance patterns 45 may be formed after the first material layers 41 have been replaced by the third material layers 44. Accordingly, the manufacturing method as described above may substantially prevent the variable resistance patterns 45 from being damaged when the first material layers 41 are replaced by the third material layers 44.

FIGS. 5A to 5E are diagrams illustrating a method of manufacturing a semiconductor device according to an embodiment of the present disclosure. Hereinafter, a detailed description of components already described above may be omitted for the sake of brevity.

Figure 5A:
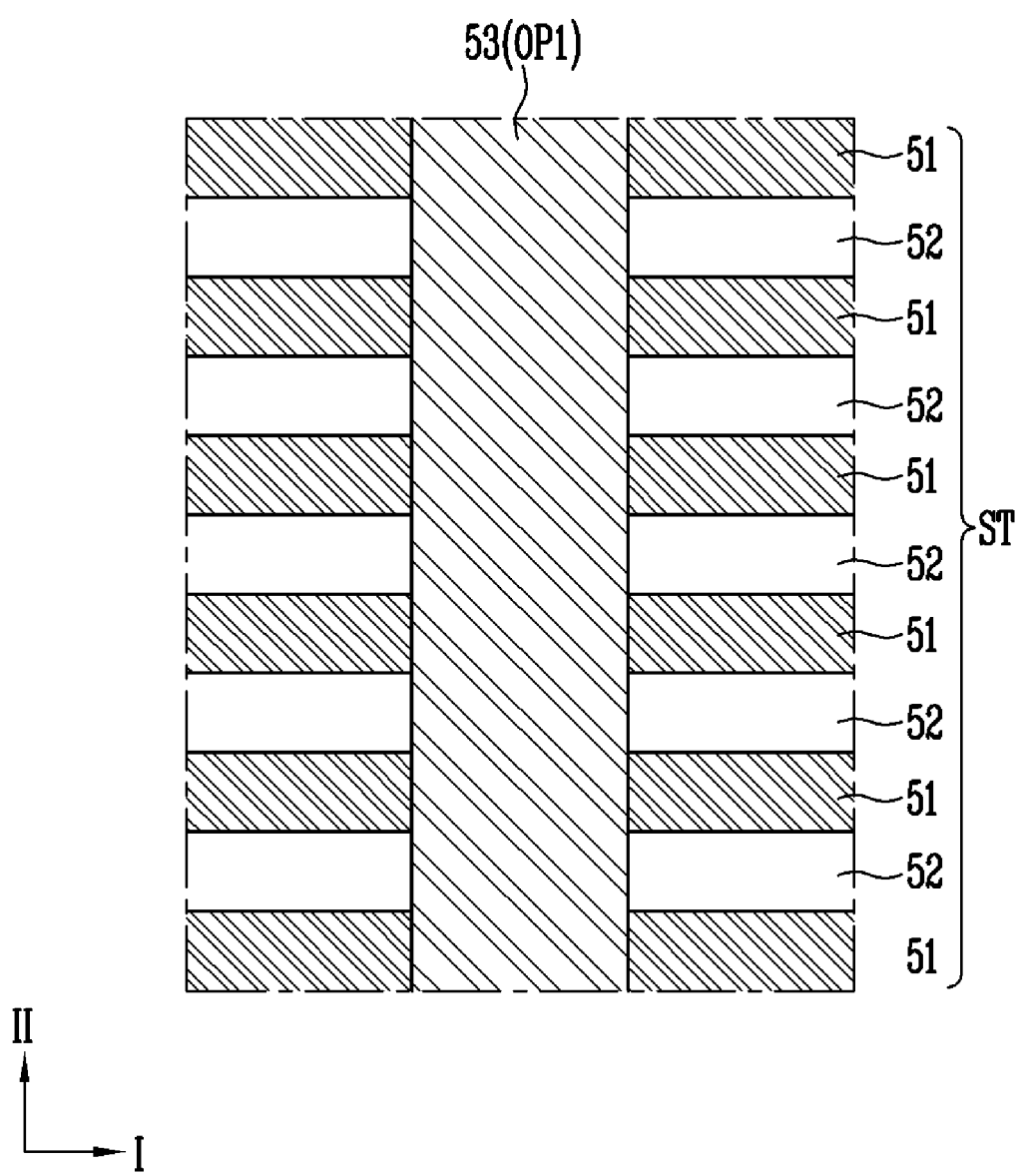

Referring to FIG. 5A, a stack structure ST may be formed. The stack structure ST may include first material layers 51 and second material layers 52 alternately stacked on each other. The first material layers 51 may include a material having high etch selectivity with respect to the second material layers 52.

Subsequently, the first opening OP1 passing through the stack structure ST may be formed. The first opening OP1 may pass through the stack structure ST in a second direction II. Subsequently, a sacrificial layer 53 may be formed in the first opening OP1. The sacrificial layer 53 may include a single layer or multiple layers. The sacrificial layer 53 may include a material having high etch selectivity with respect to the first material layers 51, the second material layers 52, and third material layers 54 to be formed in a subsequent process.

Figure 5B:
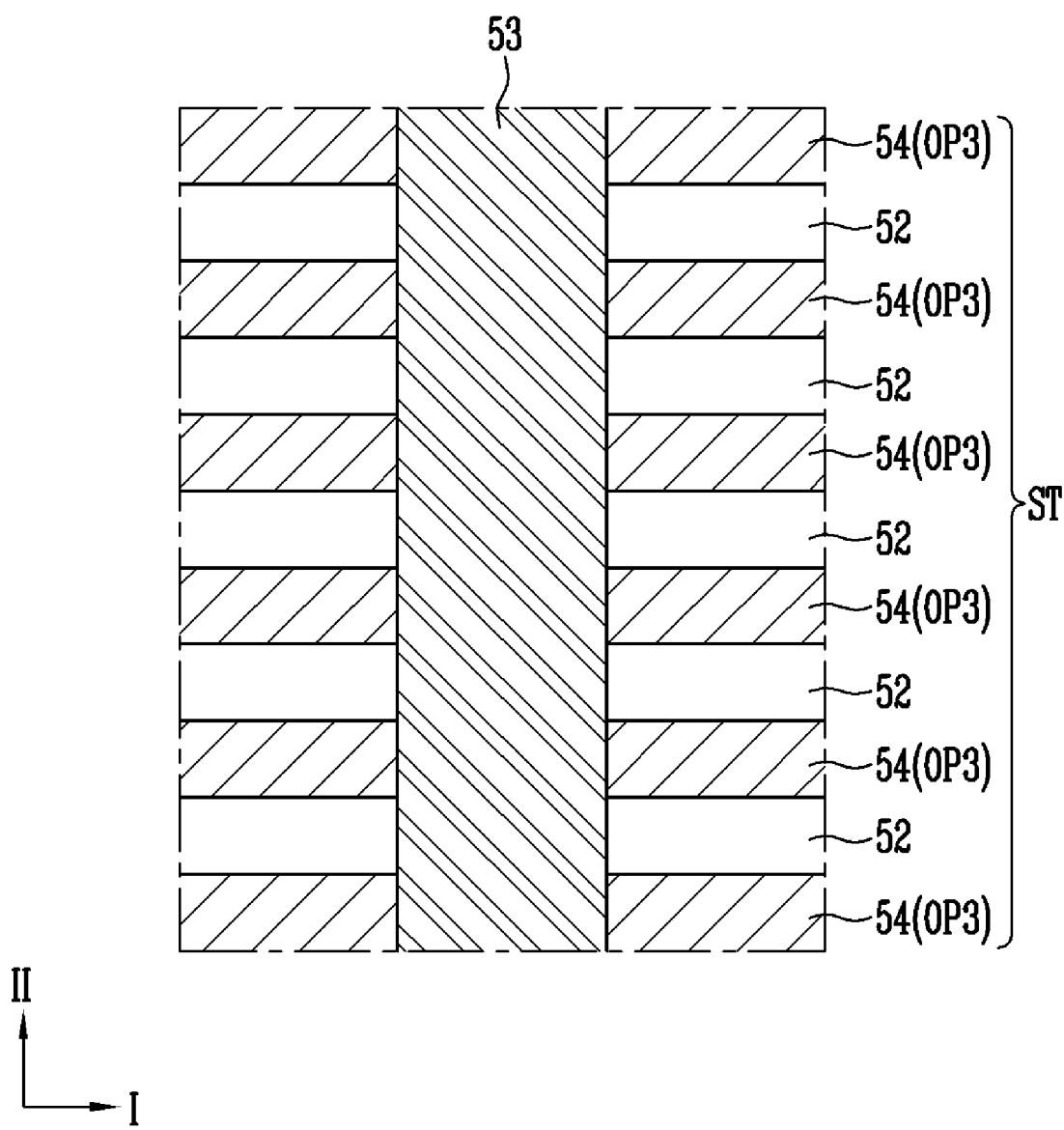

Referring to FIG. 5B, the first material layers 51 may be replaced by the third material layers 54. The third material layers 54 may be first electrodes. The third material layers 54 may include a conductive material, metal silicide, or the like. Alternatively, a process of replacing the first material layers 51 by the third material layers 54 may be omitted.

Figure 5C:
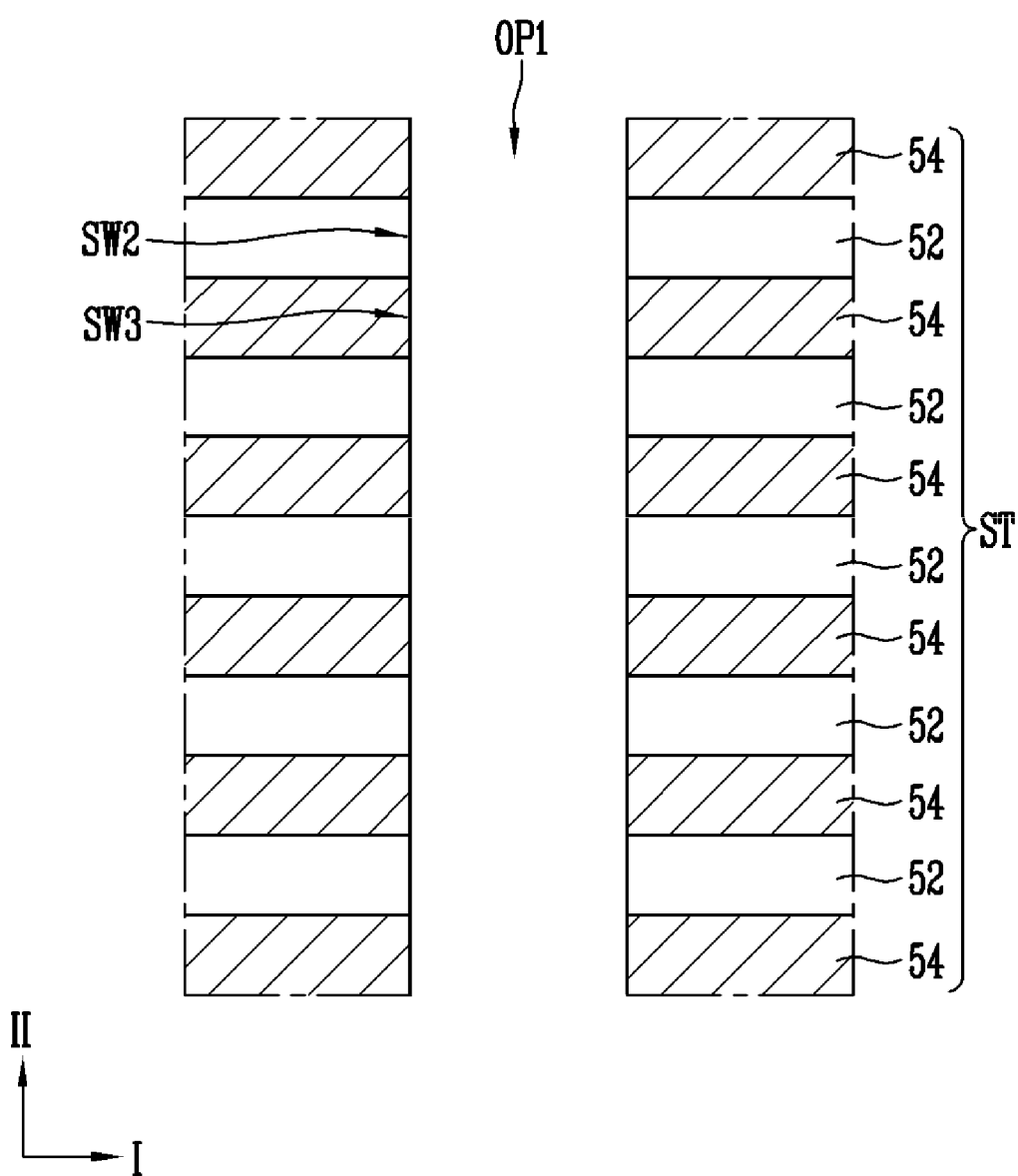

Referring to FIG. 5C, the sacrificial layer 53 may be removed. Accordingly, the first opening OP1 may be opened again. The third sidewalls SW3 of the third material layers 54 and the second sidewalls SW2 of the second material layers 52 may be exposed by the first opening OP1. The third sidewalls SW3 may be substantially aligned with the second sidewalls SW2.

Figure 5D:
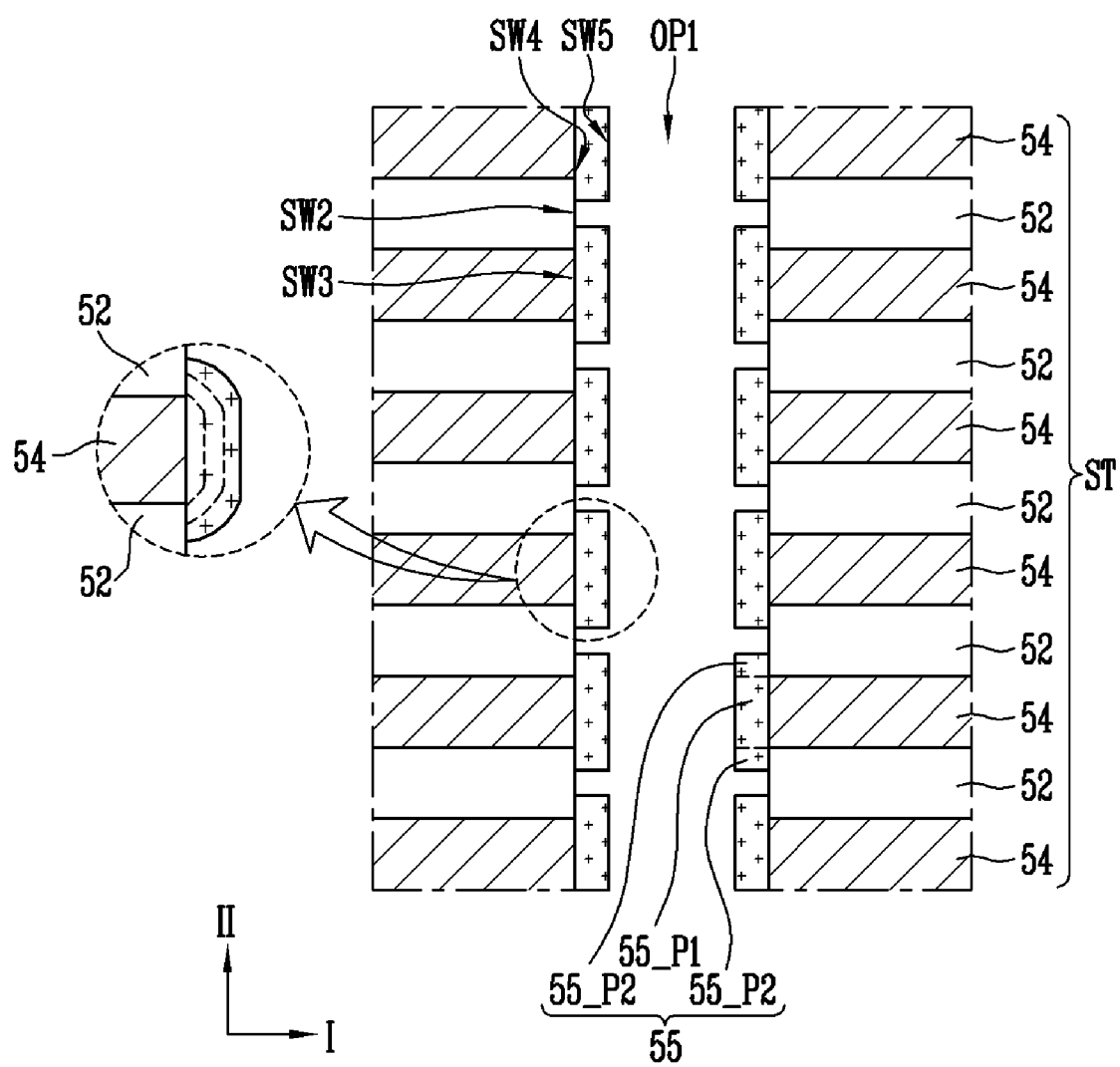

Referring to FIG. 5D, variable resistance patterns 55 may be formed. The variable resistance patterns 55 may be selectively formed on the third sidewalls SW3 of the third material layers 54. The variable resistance patterns 55 may expand over the second sidewalls SW2 of the second material layers 52. However, one or more conditions of forming the variable resistance patterns 55 may be controlled such that the variable resistance patterns 55 that neighbor in the second direction II are spaced apart from each other.

Each of the variable resistance patterns 55 may include a first portion 55_P1 and second portions 55_P2. The first portion 55_P1 may be located to correspond to each of the third material layers 54, and the second portions 55_P2 may be located to correspond to the second material layers 52. In addition, each of the variable resistance patterns 55 may include the fourth sidewall SW4 contacting each of the third material layers 54 and a fifth sidewall SW5 exposed through the first opening OP1.

According to an embodiment, the variable resistance patterns 55 may be formed by a selective deposition method or a selective growth method. The third sidewalls SW3 of the third material layers 54 which are exposed through the first opening OP1 may be used as seeds to selectively deposit or grow a variable resistance material. Because the third sidewalls SW3 are substantially aligned with the second sidewalls SW2, the first opening OP1 may include a flat inner surface and the fourth sidewalls SW4 of the variable resistance patterns 55 may include a flat surface. Because the variable resistance material is selectively deposited from the third sidewalls SW3, each of the fourth sidewalls SW4 may include a curved surface caused during a deposition process (please refer to an enlarged view in a dashed circle of FIG. 5D). Interfaces between the second material layers 52 and the third material layers 54 may be covered by the variable resistance patterns 55 by overdepositing or overgrowing the variable resistance material when the variable resistance patterns 55 are formed.

Referring to FIG. 5E, a conductive layer 56 may be formed in the first opening OP1. The conductive layer 56 may be a second electrode. The conductive layer 56 may include a first portion 56_P1 and second portions 56_P2. The first portion 56_P1 may extend in the second direction II. The second portions 56_P2 may be coupled to the first portion 56_P1 and each of the second portions 56_P2 may protrude from the first portion 56_P1 in the first direction I. Each of the second portions 56_P2 may be interposed between the variable resistance patterns 55.

According to the manufacturing method as described above with reference to FIGS. 5A to 5E, the variable resistance patterns 55 spaced apart from each other may be formed in the first opening OP1. Accordingly, unlike the embodiments described above with reference to FIGS. 3A to 4D, a process of forming the second openings OP2 may be omitted, and thus a semiconductor device (e.g., the semiconductor device in FIG. 2) may be fabricated using the relatively simple manufacturing method according to the embodiment shown in FIGS. 5A to 5E. Moreover, unlike the third material layers 44 shown in FIG. 4C, the third material layers 54 in FIG. 5C may not be selectively etched through the first opening OP1, and thus damage to the third material layers 54 may be reduced to improve operational reliability of memory cells including the third material layers 54. In addition, because the variable resistance patterns 55 are formed along the flat inner surface of the first opening OP1, the variable resistance patterns 55 may have a uniform profile.

Figure 6:
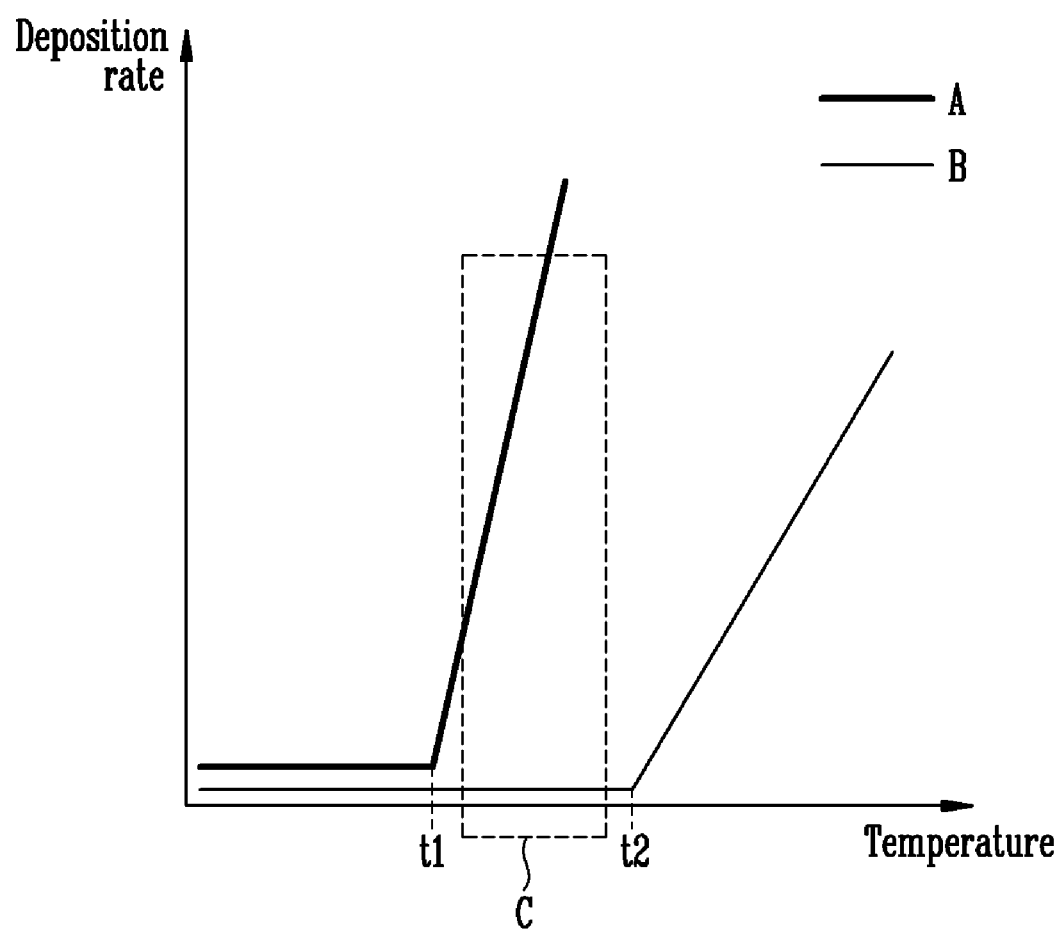
FIG. 6 is a graph illustrating a condition of forming a variable resistance pattern by a method of manufacturing a semiconductor device according to an embodiment of the present disclosure.

FIG. 6 is a graph illustrating a condition (e.g., a process temperature) of forming a variable resistance pattern by a method of manufacturing a semiconductor device according to an embodiment of the present disclosure. On the graph, an x axis represents a temperature and a y axis represents a deposition rate of a variable resistance pattern.

Referring to FIG. 6, a deposition rate of a variable resistance pattern may vary depending on a material of a deposition surface and a temperature. A curve labelled A represents a deposition rate of a variable resistance pattern on a deposition surface (or a first surface) including a conductive material such as polysilicon or metal. A curve labelled B represents a deposition rate of a variable resistance pattern on a deposition surface (or a second surface) including a dielectric material such as an oxide or a nitride.

When a process temperature is lower than a first critical temperature t1, the variable resistance pattern might not be substantially deposited on the first surface, and when the process temperature is equal to or higher than the first critical temperature t1, the variable resistance pattern may be deposited on the first surface. When the process temperature is lower than a second critical temperature t2, the variable resistance pattern might not be substantially deposited on the second surface, and when the process temperature is equal to or higher than the second critical temperature t2, the variable resistance pattern may be deposited on the second surface. Accordingly, the variable resistance pattern may be selectively deposited on the first surface by adjusting the process temperature to a condition C that is higher than the first critical temperature t1 and lower than the second critical temperature t2. According to an embodiment, a variable resistance pattern may be selectively deposited or grown at a temperature of from 200 to 300° C.

Alternatively, as a condition for selectively depositing or growing a variable resistance pattern, a process condition such as a pressure or gas flow (e.g., a volumetric flow rate) as well as a temperature may be adjusted. According to an embodiment, a variable resistance pattern may be selectively deposited or grown at a pressure of from 1 to 5 Torr. According to an embodiment, a variable resistance pattern may be selectively deposited or grown by adjusting gas flow between 50 and 500 sccm. A specific process condition may be changed depending on a precursor, integration density, or the like.

The memory circuit or the semiconductor device according to the above-described embodiments may be used in various devices or systems. FIGS. 7 to 10 show some examples of a device or a system that may implement the memory circuit or the semiconductor device of the above-described embodiments.

Figure 7:
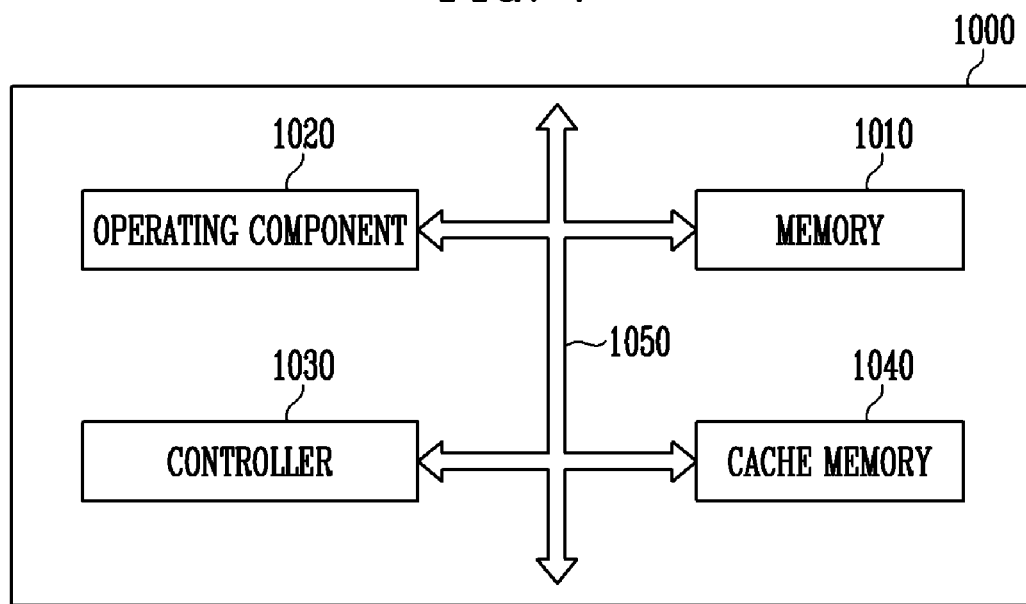
FIG. 7 illustrates an example of the configuration of a microprocessor implementing a memory device according to an embodiment of the present disclosure.

FIG. 7 illustrates an example of the configuration of a microprocessor 1000 implementing a memory device according to an embodiment of the present disclosure.

Referring to FIG. 7, the microprocessor 1000 may control and adjust a series of processes of receiving data from various types of external devices, processing the data and sending results of processing the data to external devices. The microprocessor 1000 may include memory 1010, an operating component 1020, and a controller 1030. The microprocessor 1000 may be various data processing devices such as a central processing unit (CPU), a graphic processing unit (GPU), a digital signal processor (DSP), and an application processor (AP).

The memory 1010 may be a processor register or a register, and may store data in the microprocessor 1000. The memory 1010 may include various types of registers including a data register, an address register, and a floating point register. The memory 1010 may temporarily store addresses at which data for performing an operation in the operating component 1020, data of a result of the performance, and data for the performance are stored.

The memory 1010 may include one or more embodiments of the semiconductor device described above. For example, the memory 1010 may include one or more semiconductor devices, the semiconductor devices may include a stack structure including first electrodes and insulating layers alternately stacked on each other; a second electrode passing through the stack structure; and variable resistance patterns each interposed between the second electrode and each of the first electrodes. Each of the first electrodes may include a first sidewall facing the second electrode, each of the insulating layers may include a second sidewall facing the second electrode, at least a part of each of the variable resistance patterns may protrude farther towards the second electrode than the second sidewall. Accordingly, reliability of the memory 1010 may be enhanced and a manufacturing process of the memory 1010 may be improved. As a result, operating characteristics of the microprocessor 1000 may be improved.

The operating component 1020 may perform various arithmetic operations or logical operations according to a result obtained by decoding an instruction by the controller 1030. The operating component 1020 may include at least one arithmetic and logic unit (ALU).

The controller 1030 may receive signals from the memory 1010, the operating component 1020, and the external devices of the microprocessor 1000, extract or decode a command, control the signal input and output of the microprocessor 1000, and execute processing represented by a program.

According to an embodiment of the present disclosure, the microprocessor 1000 may further include cache memory 1040 that temporarily stores data input from an external device other than the memory 1010, or data to be output to the external device. The cache memory 1040 may exchange data with the memory 1010, the operating component 1020 and the controller 1030 through a bus interface 1050.

Figure 8:
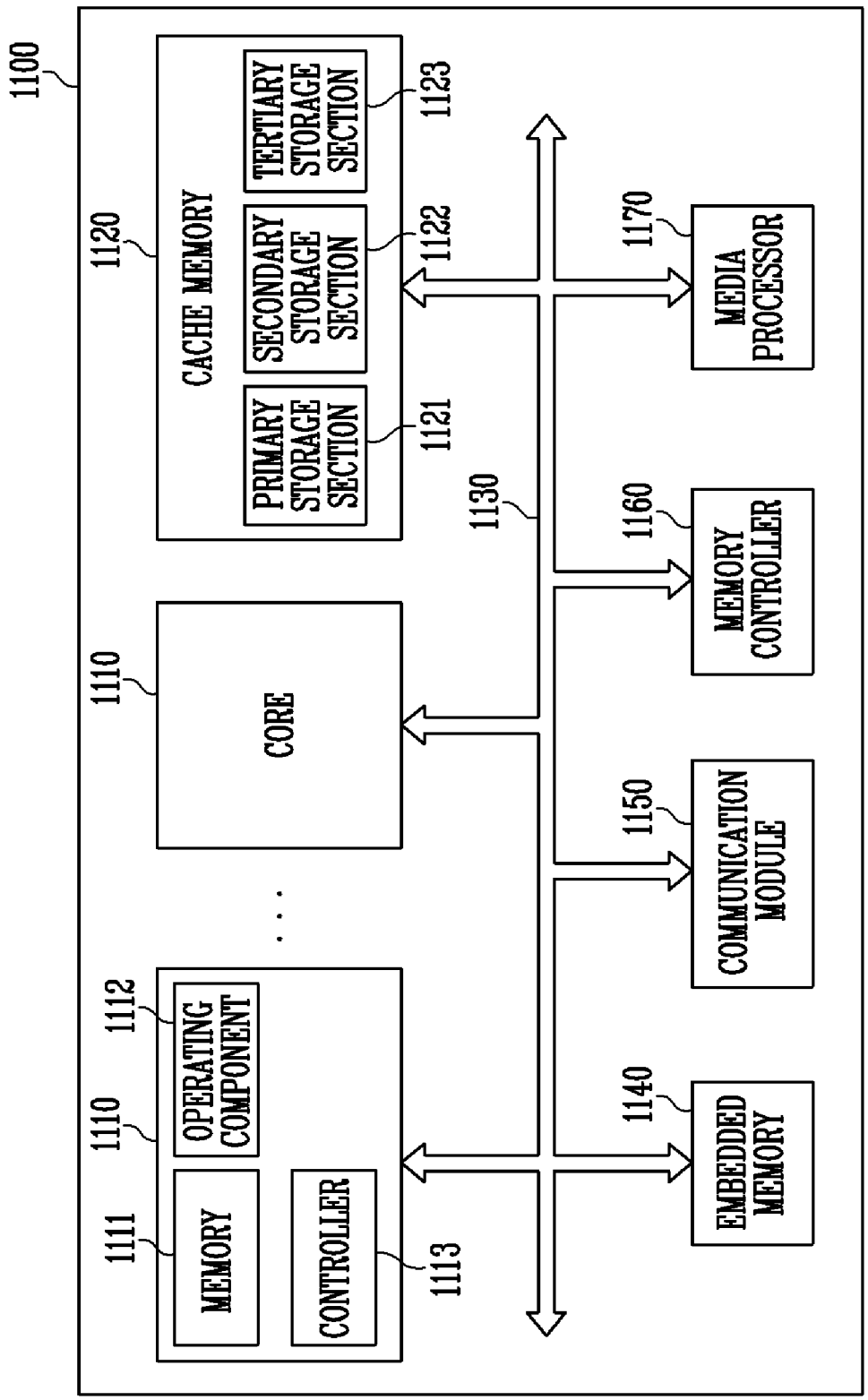
FIG. 8 illustrates an example of the configuration of a processor implementing a memory device according to an embodiment of the present disclosure.

FIG. 8 illustrates an example of the configuration of a processor 1100 implementing a memory device according to an embodiment of the present disclosure.

Referring to FIG. 8, the processor 1100 may include various functions in addition to the function of the microprocessor 1000 described above to improve performance and implement a multifunction. The processor 1100 may include a core 1110 serving as a microprocessor, cache memory 1120 temporarily storing data, and a bus interface 1130 transferring data between internal and external devices. The processor 1100 may include various types of systems on chip (SoCs) such as a multi-core processor, a graphic processing unit (GPU), and an application processor (AP).

According to an embodiment of the present disclosure, the core 1110 may perform arithmetic and logic operations on the data input from the external device and may include memory 1111, an operating component 1112, and a controller 1113. The memory 1111, the operating component 1112, and the controller 1113 may be substantially the same as the memory 1010, the operating component 1020, and the controller 1030 described above, respectively.

The cache memory 1120 may temporarily store data so as to compensate for a difference in data processing speed between the core 1110 operating at a high speed and the external device operating at a low speed. The cache memory 1120 may include a primary storage section 1121, a secondary storage section 1122, if large capacity is required, further include a tertiary storage section 1123, and if necessary, further include more sections. In other words, the number of storage sections included in the cache memory 1120 may vary depending on design. The primary, secondary, and tertiary storage sections 1121, 1122, and 1123 may have the same or different processing speeds for storing and determining data. When the respective storage sections have different processing speeds, the primary storage section 1121 may have the highest processing speed among the primary, secondary, and tertiary storage sections 1121, 1122, and 1123. At least one of the primary, secondary, and tertiary storage sections 1121, 1122, and 1123 of the cache memory 1120 may include at least one of the embodiments of the above-described semiconductor device. For example, the cache memory 1120 may include one or more semiconductor devices, the semiconductor devices may include a stack structure including first electrodes and insulating layers alternately stacked on each other; a second electrode passing through the stack structure; and variable resistance patterns each interposed between the second electrode and each of the first electrodes. Each of the first electrodes may include a first sidewall facing the second electrode, each of the insulating layers may include a second sidewall facing the second electrode, at least a part of each of the variable resistance patterns may protrude farther towards the second electrode than the second sidewall. Accordingly, reliability of the cache memory 1120 may be enhanced and a manufacturing process of the cache memory 1120 may be improved. As a result, operating characteristics of the processor 1100 may be improved.

According to the embodiment described with reference to FIG. 8, all of the primary, secondary, and tertiary storage sections 1121, 1122, and 1123 are included in the cache memory 1120. However, some or all of the primary, secondary, and tertiary storage sections 1121, 1122, and 1123 of the cache memory 1120 may be provided in the core 1110 to compensate for the difference in processing speeds of the core 1110 and the external device.

The bus interface 1130 may couple the core 1110, the cache memory 1120, and the external device so that data may be efficiently transferred.

According to an embodiment of the present disclosure, the processor 1100 may include a plurality of cores 1110, which may share the cache memory 1120. The plurality of cores 1110 and the cache memory 1120 may be directly coupled to each other or may be coupled through the bus interface 1130. Each of the plurality of cores 1110 may have the same configuration as the above-described core. A storage section in each of the plurality of cores 1110 and a storage section external to the core 1110 may be shared through the bus interface 1130.

According to an embodiment of the present disclosure, the processor 1100 may further include embedded memory 1140 storing data, a communication module component 1150 wiredly or wirelessly transmitting or receiving the data to or from an external device, a memory controller 1160 driving an external memory device, and a media processor 1170 processing and outputting data, processed by the processor 1100 or input from the external input device, to an external input device. The processor 1100 may further include various other modules and devices. The further included modules may exchange data with each other and with the core 1110 and the cache memory 1120 through the bus interface 1130.

The embedded memory 1140 may include non-volatile memory as well as volatile memory. Volatile memory may include Dynamic Random Access Memory (DRAM), Mobile DRAM, Static Random Access Memory (SRAM), memory having similar functions thereto, or the like. Non-volatile memory may include Read Only Memory (ROM), NOR Flash Memory, NAND Flash Memory, Phase Change Random Access Memory (PRAM), Resistive Random Access Memory (RRAM), Spin Transfer Torque Random Access Memory (STTRAM), Magnetic Random Access Memory (MRAM), memory having similar functions thereto, or the like.

The communication module component 1150 may include a module capable of being connected to a wired network, a module capable of being connected to a wireless network, or both. A wired network module may include, as various devices which transmit and receive data through a transmission line, a Local Area Network (LAN), a Universal Serial Bus (USB), an Ethernet, Power Line Communication (PLC), or the like. A wireless network module may include, as various devices which transmit and receive data without a transmission line, Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), a Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

The memory controller 1160 may include various memory controllers for processing and managing data transferred between the processor 1100 and an external storage device which operates according to a different communication standard from that of the processor 1100. For example, the memory controller 1160 may include a controller controlling Integrated Device Electronics (IDE), Serial Advanced Technology Attachment (SATA), a Small Computer System Interface (SCSI), a Redundant Array of Independent Disks (RAID), a Solid State Drive (SSD), External SATA (eSATA), Personal Computer Memory Card International Association (PCMCIA), a Universal Serial Bus (USB), a secure digital (SD) card, a mini secure digital (mSD) card, a micro SD card, a secure digital high capacity (SDHC) card, a memory stick card, a smart media (SM) card, a MultiMedia card (MMC), an embedded MMC (eMMC), a compact flash (CF) card, or the like.

The media processor 1170 may process data processed by the processor 1100, or data in the form of video or audio or in another form, which is input from an external input device, and may output the processed data to an external interface device. The media processor 1170 may include a Graphics Processing Unit (GPU), a Digital Signal Processor (DSP), a High Definition Audio (HD audio), a high definition multimedia interface (HDMI) controller, or the like.

Figure 9:
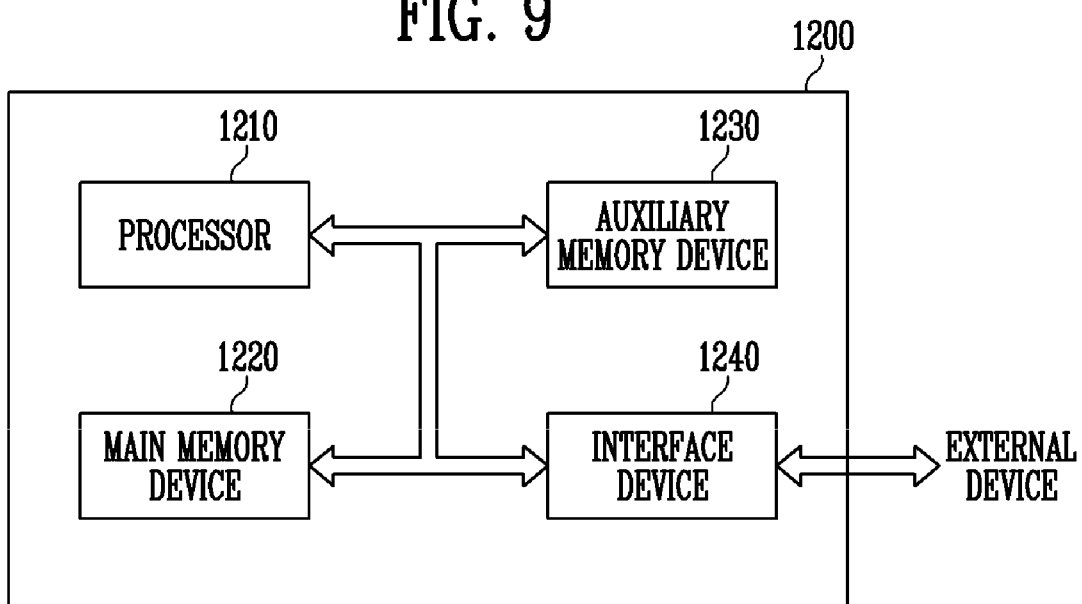
FIG. 9 illustrates an example of the configuration of a system implementing a memory device according to an embodiment of the present disclosure.

FIG. 9 illustrates an example of the configuration of a system 1200 implementing a memory device according to an embodiment of the present disclosure.

Referring to FIG. 9, the system 1200 may refer to a device processing data. The system 1200 may perform inputting, processing, outputting, communicating, storing, and the like to perform a series of operations on data. The system 1200 may include a processor 1210, a main memory device 1220, an auxiliary memory device 1230, and an interface device 1240. According to an embodiment of the present disclosure, the system 1200 may be various electronic systems that operate using a processor. Examples of the system 1200 include a computer, a server, a Personal Digital Assistant (PDA), a portable computer, a web tablet, a wireless phone, a mobile phone, a smart phone, a digital music player, a Portable Multimedia Player (PMP), a camera, a Global Positioning System (GPS), a video camera, a voice recorder, Telematics, an Audio Visual (AV) system, or a smart television.

The processor 1210 may control interpretation of a command input thereto and processing such as operations and comparison of data stored in the system 1200. The processor 1210 may be substantially the same as the microprocessor 1000 or the processor 1100 described above.

The main memory device 1220 may refer to memory storage that stores program codes and/or data transferred from the auxiliary memory device 1230 and performs execution when a program is executed. The program codes and data stored in the main memory device 1220 may be retained even in the absence of a power supply. The auxiliary memory device 1230 may refer to a memory device designed to store program codes or data. Although the auxiliary memory device 1230 has a lower speed than the main memory device 1220, the auxiliary memory device 1230 may store more data than the main memory device 1220. The main memory device 1220 or the auxiliary memory device 1230 may include one or more of the above-described embodiments of the electronic device. For example, the main memory device 1220 or the auxiliary memory device 1230 may include one or more semiconductor devices, the semiconductor devices may include a stack structure including first electrodes and insulating layers alternately stacked on each other; a second electrode passing through the stack structure; and variable resistance patterns each interposed between the second electrode and each of the first electrodes. Each of the first electrodes may include a first sidewall facing the second electrode, each of the insulating layers may include a second sidewall facing the second electrode, at least a part of each of the variable resistance patterns may protrude farther towards the second electrode than the second sidewall. Accordingly, reliability of the main memory device 1220 or the auxiliary memory device 1230 may be enhanced and a manufacturing process of the main memory device 1220 or the auxiliary memory device 1230 may be improved. As a result, operating characteristics of the system 1200 may be improved.

In addition, the main memory device 1220 or the auxiliary memory device 1230 may include a memory system 1300 to be described below with reference to FIG. 10, in addition to the semiconductor device of the above-described embodiment, or without including the semiconductor device of the above-described embodiment.

The interface device 1240 may be for performing exchange of commands and data between the system 1200 of this embodiment and an external device. The interface device 1240 may be a keypad, a keyboard, a mouse, a speaker, a microphone, a display, various human interface devices (HIDs), a communication device, and the like. The communication device may substantially the same as the communication module component 1150 described above.

Figure 10:
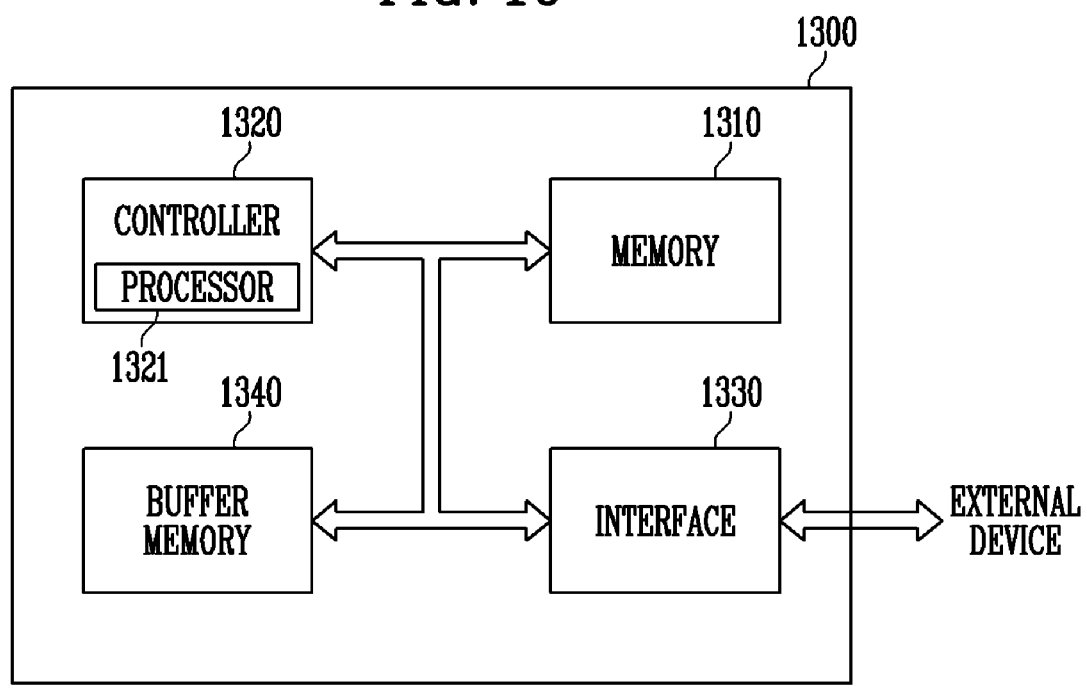
FIG. 10 illustrates an example of the configuration of a memory system implementing a memory device according to an embodiment of the present disclosure.

FIG. 10 illustrates an example of the configuration of a memory system 1300 implementing a memory device according to an embodiment of the present disclosure.

Referring to FIG. 10, the memory system 1300 may include memory 1310 that has non-volatile characteristics as a component for storing data, a controller 1320 for controlling the memory 1310, an interface 1330 for being coupled to an external device, and buffer memory 1340 for temporarily storing data to efficiently transfer data input/output between the interface 1330 and the memory 1310. The memory system 1300 may refer to memory merely storing data, or further, a data storage device for conserving the stored data for a long time. The memory system 1300 may be a disk-type device such as a Solid State Drive (SSD) or a card-type device such as Universal Serial Bus (USB) memory, a Secure Digital (SD) card, a mini Secure Digital (mSD) card, a micro Secure Digital (SD) card, a Secure Digital High Capacity (SDHC) card, a memory stick card, a Smart Media (SM) card, a MultiMedia card (MMC), an embedded MMC (eMMC), or a Compact Flash (CF) card.

The memory 1310 or the buffer memory 1340 may include at least one of the embodiments of the above-described semiconductor device. For example, the memory 1310 or the buffer memory 1340 may include one or more semiconductor devices, the semiconductor devices may include a stack structure including first electrodes and insulating layers alternately stacked on each other; a second electrode passing through the stack structure; and variable resistance patterns each interposed between the second electrode and each of the first electrodes. Each of the first electrodes may include a first sidewall facing the second electrode, each of the insulating layers may include a second sidewall facing the second electrode, at least a part of each of the variable resistance patterns may protrude farther towards the second electrode than the second sidewall. Accordingly, reliability of the memory 1310 or the buffer memory 1340 may be enhanced and a manufacturing process of the memory 1310 or the buffer memory 1340 may be improved. As a result, operating characteristics of the memory system 1300 may be improved.

The memory 1310 or the buffer memory 1340 may include various volatile or non-volatile memory, in addition to the semiconductor device of the above-described embodiment, or without including the semiconductor device of the above-described embodiment.

The controller 1320 may control data exchange between the memory 1310 and the interface 1330. The controller 1320 may include a processor 1321 for performing an operation for processing commands input through the interface 1330 from an external device of the memory system 1300.

The interface 1330 may be provided to exchange commands and data between the memory system 1300 and external devices. When the memory system 1300 is a card-type device or a disk-type device, the interface 1330 may be compatible with interfaces used in the card-type device or the disk-type device or interfaces used in devices similar to the card-type device or the disk-type device. The interface 1330 may be compatible with one or more interfaces having different types.

According to the present disclosure, integration density of a semiconductor device may be improved. In addition, a semiconductor device having a stabilized structure and improved reliability may be provided.

What is claimed is:

1. A semiconductor device, comprising:
a stack structure including first electrodes and insulating layers alternately stacked on each other;
a second electrode passing through the stack structure; and
variable resistance patterns each interposed between the second electrode and a corresponding one of the first electrodes,
wherein the first electrodes include first sidewalls that each face the second electrode,
wherein the insulating layers include second sidewalls that each face the second electrode,
wherein at least a part of each of the variable resistance patterns protrudes farther towards the second electrode than a corresponding one of the second sidewalls, and
wherein the second electrode includes an air gap overlapping at least one of the variable resistance patterns.

2. The semiconductor device of claim 1, wherein each of the variable resistance patterns includes a first portion interposed between an adjacent pair of the insulating layers and a second portion extending into the second electrode.

3. The semiconductor device of claim 2, wherein the variable resistance patterns include a first variable resistance pattern located at an upper portion of the stack structure and a second variable resistance pattern located at a lower portion of the stack structure, and
wherein the second portion of the first variable resistance pattern protrudes farther towards the second electrode than that of the second variable resistance pattern.

4. The semiconductor device of claim 2, wherein the first sidewall of the corresponding one of the first electrodes is spaced farther apart from a sidewall of the second electrode than the corresponding one of the second sidewalls.

5. The semiconductor device of claim 1, wherein each of the variable resistance patterns includes a first portion interposed between the corresponding one of the first electrodes and the second electrode and a second portion interposed between a corresponding one of the insulating layers and the second electrode, and
wherein the first portion and the second portion extend into the second electrode.

6. The semiconductor device of claim 5, wherein the first sidewall of the corresponding one of the first electrodes is aligned with the corresponding one of the second sidewalls.

7. The semiconductor device of claim 1, wherein the variable resistance patterns are spaced apart from each other in a direction in which the first electrodes and the insulating layers are stacked.

8. The semiconductor device of claim 1, wherein each of the variable resistance patterns includes a third sidewall contacting the first sidewall of the corresponding one of the first electrodes and a fourth sidewall contacting the second electrode, and
wherein the fourth sidewall includes a curved surface.

9. The semiconductor device of claim 1, wherein the second electrode comprises:
a first portion extending in a direction in which the first electrodes and the insulating layers are stacked; and
second portions protruding from the first portion, each of the second portions being disposed between an adjacent pair of the variable resistance patterns.

10. The semiconductor device of claim 9, wherein each of the second portions contact a corresponding one of the insulating layers.

11. The semiconductor device of claim 9, wherein the air gap is included in at least one of the second portions.

12. The semiconductor device of claim 1, wherein each of the variable resistance patterns includes a chalcogenide that maintains an amorphous state when a program operation is performed.

13. The semiconductor device of claim 1, further comprising:
at least one of switching patterns and third electrodes between the first electrodes and the variable resistance patterns.

14. The semiconductor device of claim 1, wherein the air gap is disposed between a neighboring pair of the variable resistance patterns in a specific direction, the first electrodes and the insulating layers being stacked in the specific direction.

15. A semiconductor device, comprising:
a stack structure including first electrodes and insulating layers alternately stacked on each other, a second electrode passing through the stack structure; and variable resistance patterns each interposed between the second electrode and a corresponding one of the first electrodes, wherein the first electrodes include first sidewalls that each face the second electrode, wherein the insulating layers include second sidewalls that each face the second electrode, and wherein each of the variable resistance patterns contacts a corresponding one of the first sidewalls and a corresponding one of the second sidewalls, and wherein the second electrode includes an air gap overlapping at least one of the variable resistance patterns.

16. The semiconductor device of claim 15, wherein each of the variable resistance patterns covers a corner of a corresponding one of the insulating layers and extends along the corresponding one of the second sidewalls.

17. The semiconductor device of claim 15, wherein the variable resistance patterns are spaced apart from each other.

18. The semiconductor device of claim 15, wherein the second electrode protrudes between at least one adjacent pair of the variable resistance patterns.

19. The semiconductor device of claim 15, further comprising:

at least one of switching patterns and third electrodes between the first electrodes and the variable resistance patterns.

20. The semiconductor device of claim 15, wherein the air gap is disposed between a neighboring pair of the variable resistance patterns in a specific direction, the first electrodes and the insulating layers being stacked in the specific direction.

* * * * *